United States Patent

Shimura et al.

[11] Patent Number: 5,864,169
[45] Date of Patent: Jan. 26, 1999

[54] SEMICONDUCTOR DEVICE INCLUDING PLATED HEAT SINK AND AIRBRIDGE FOR HEAT DISSIPATION

[75] Inventors: Teruyuki Shimura; Masayuki Sakai; Ryo Hattori; Hiroshi Matsuoka; Manabu Katoh, all of Itami, Japan

[73] Assignee: Mitsubishi Denki Kabushiki Kaisha, Tokyo, Japan

[21] Appl. No.: 503,952

[22] Filed: Jul. 19, 1995

[30] Foreign Application Priority Data

Jul. 20, 1994 [JP] Japan .................................. 6-167928
Feb. 6, 1995 [JP] Japan .................................. 7-018170
Jul. 14, 1995 [JP] Japan .................................. 7-178644

[51] Int. Cl.$^6$ ................. H01L 31/0328; H01L 27/082; H01L 23/34
[52] U.S. Cl. ........................ 257/587; 257/197; 257/712
[58] Field of Search ....................... 257/712, 713, 257/719, 720, 197, 198, 276

[56] References Cited

U.S. PATENT DOCUMENTS 4,794,093 12/1988 Tong et al. .......................... 437/203
4,970,578 11/1990 Tong et al. .......................... 357/81

FOREIGN PATENT DOCUMENTS

| 0 606 522 | 7/1994 | European Pat. Off. . |
| 0606522 | 7/1994 | European Pat. Off. . |
| 4416696 | 11/1994 | Germany . |
| 62-0145845 | 6/1987 | Japan . |
| 0346262 | 12/1992 | Japan . |
| 9203848 | 3/1992 | WIPO . |

OTHER PUBLICATIONS

Bayraktaroglu et al, "Very High–Power–Density CW Operation Of GaAs/AlGaAs Microwave Heterojunction Bipolar Transistors", IEEE Electron Device Letters, vol. 14, No. 10, Oct. 1993, pp. 493–495.

Primary Examiner—Wael Fahmy
Attorney, Agent, or Firm—Leydig, Voit & Mayer, Ltd.

[57] ABSTRACT

A semiconductor device includes a semiconductor substrate having opposite front and rear surfaces; a semiconductor element disposed on the front surface of the semiconductor substrate and including an electrode; a PHS for dissipating heat generated in the semiconductor element, the PHS including a metal layer and disposed on the rear surface of the semiconductor substrate; a via-hole including a through-hole penetrating through the semiconductor substrate from the front surface to the rear surface and having an inner surface, and a metal disposed in the through-hole and contacting the PHS; and an air-bridge wiring including a metal film and having first and second portions, the air-bridge contacting the electrode of the semiconductor element at the first portion and contacting the metal of the via-hole at the second portion. Therefore, heat produced in the semiconductor element is transferred to the PHS not only through the semiconductor substrate just under the element but also through the air-bridge wiring and the via-hole, whereby the heat dissipating property of the device is significantly improved.

19 Claims, 26 Drawing Sheets

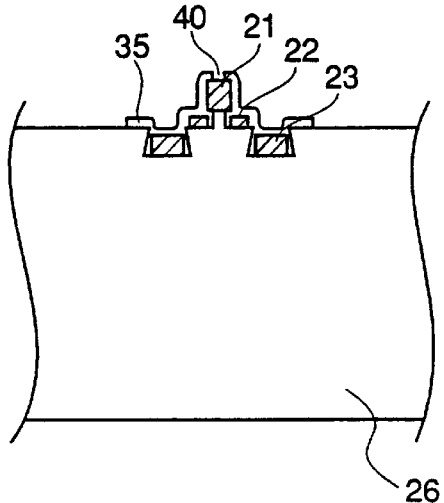
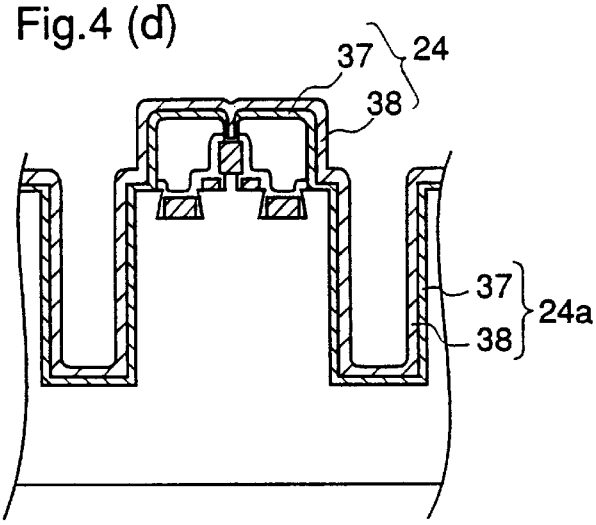
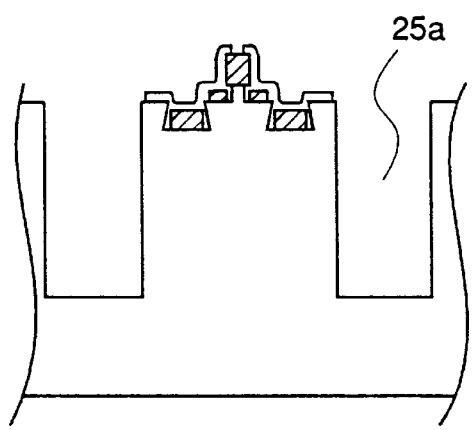
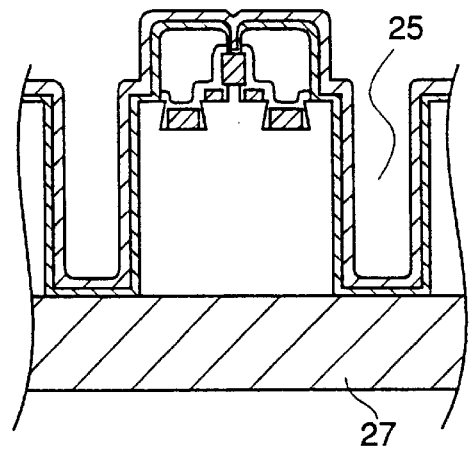
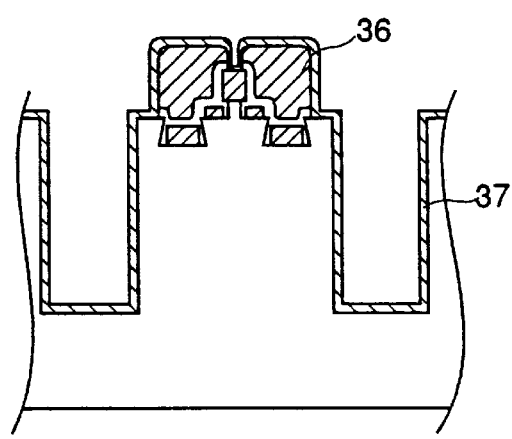

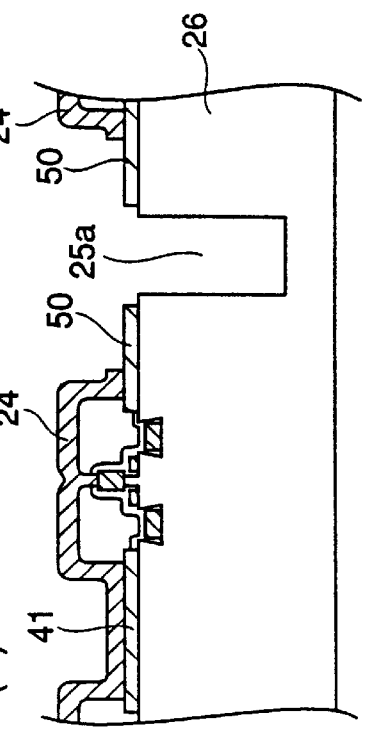
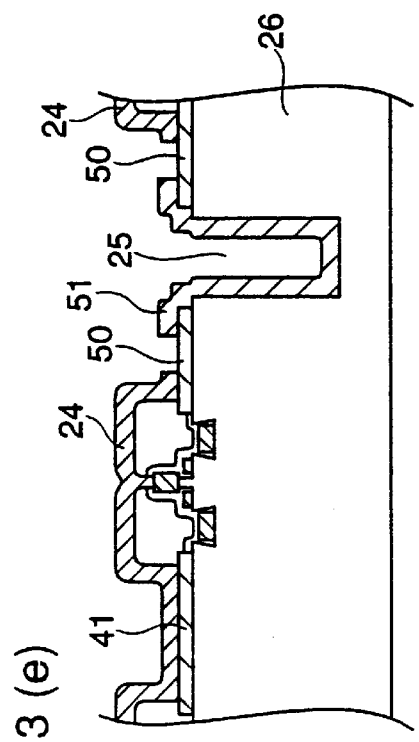
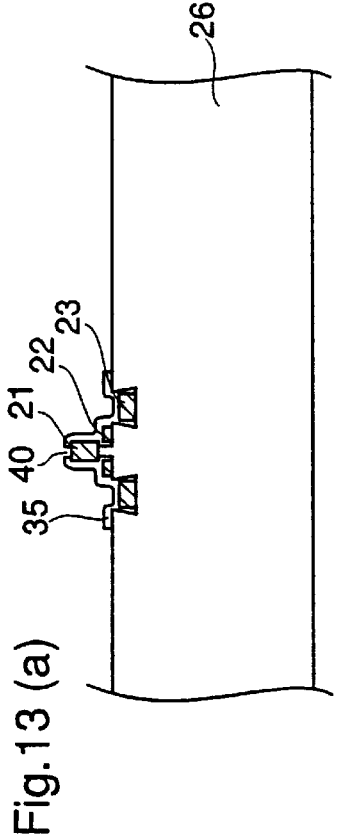
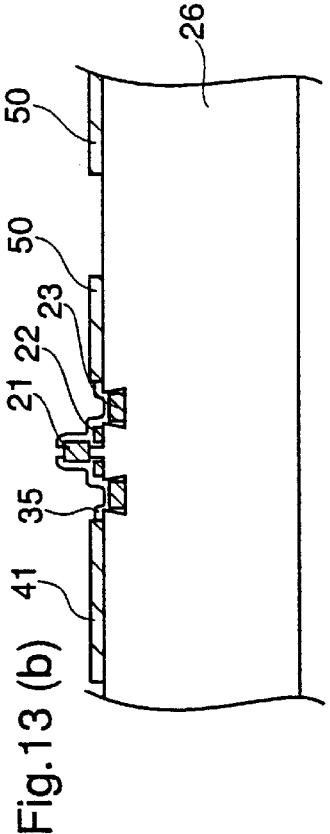
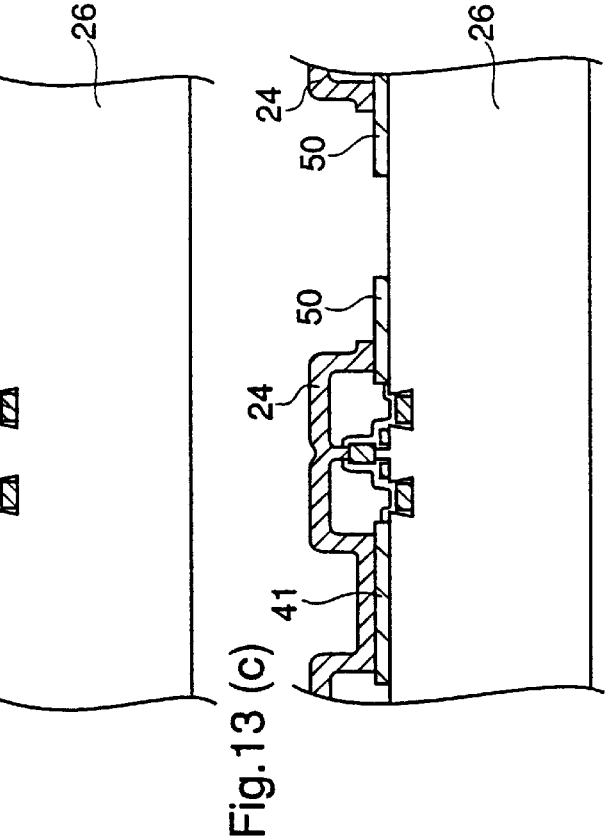
Fig.13 (a)  Fig.13 (b)  Fig.13 (c)  Fig.13 (d)  Fig.13 (e)

SEMICONDUCTOR DEVICE INCLUDING PLATED HEAT SINK AND AIRBRIDGE FOR HEAT DISSIPATION

FIELD OF THE INVENTION

The present invention relates to semiconductor devices and, more particularly, to heterojunction bipolar transistors (hereinafter referred to as HBTs) having an improved heat dissipation property. The invention also relates to methods for fabricating the HBTs.

BACKGROUND OF THE INVENTION

In recent years, HBTs comprising GaAs and related compounds (hereinafter referred to as GaAs series HBTs) have been developed for high-power output microwave devices. However, since the GaAs series HBTs have high thermal resistance, the junction temperature undesirably increases when used as high-power output devices. This undesired increase in the junction temperature is suppressed in a prior art HBT structure described by Burhan Bayraktaroglu et al in IEEE Electron Device Letters, Vol. 14 (1996), pp. 493–495. FIG. 26 shows a cross-sectional view of the prior art HBT. In the figure, reference numeral 26 designates a GaAs substrate. A plurality of HBT elements, i.e., unit elements, are arranged in an array on the surface of the GaAs substrate 26 and electrically connected in parallel with each other. Each HBT element includes an emitter electrode 21, a collector electrode 22, and a pair of base electrodes 23. Metal wirings 50 are disposed on the surface of the GaAs substrate 26 at opposite sides of the array of the HBT elements. The emitter electrodes 21 of the HBT elements are connected to an air-bridge wiring 24 having opposite ends connected to the metal wirings 50, and heat generated in the HBT elements are transferred through the air-bridge wiring 24 and the metal wirings 50 to the GaAs substrate 26. Thereby, more than the quantity of heat dissipated through the substrate directly under the HBT elements is dissipated.

However, in the prior art structure shown in FIG. 26, because the heat spreading regions through the air-bridge wiring 24 to the substrate 26 are present only on both sides of the array of the HBT elements, this structure still has the following drawbacks.

(1) Since the length of the air-bridge wiring 24 from each HBT element to the heat spreading region is long, the thermal resistance is not sufficiently reduced.

(2) Since the length of the air-bridge wiring 24 from each HBT element to the heat spreading region is not uniform, the thermal resistance varies from element to element.

(3) Since the length of the air-bridge wiring 24 from each HBT element to the heat spreading area is long, the emitter inductance is increased.

(4) The air-bridge wiring 24 must be thicker than 10 μm to improve the heat conduction of the air-bridge wiring 24, but it is difficult to fabricate such a thick air-bridge wiring.

(5) Since the thermal separation between the HBT elements is not sufficient, the temperature of the elements in the center of the array unfavorably increases.

As described above, in the prior art HBT shown in FIG. 26, the heat dissipation property is improved to some extent by the air-bridge structure. However, because the air-bridge wiring is long, the improvement in the heat dissipation property is not sufficient. In addition, since the thermal resistance varies from element to element, the junction temperature varies from element to element, resulting in variations in the electrical characteristics of the HBT elements. Further, the large emitter inductance causes a reduction in gain when the device is used in a high frequency band. Furthermore, since the air-bridge wiring must be thick, the fabricating process is complicated. In addition, since the thermal separation between the HBT elements is insufficient, thermal interference occurs between the HBT elements, whereby the temperature of the elements in the center of the array unfavorably increases.

SUMMARY OF THE INVENTION

An object of the present invention is to provide a semiconductor device including a plurality of unit semiconductor elements that provides low and uniform thermal resistances of the semiconductor elements, sufficient thermal separation between the semiconductor elements, and reduced inductance caused by an air-bridge wiring, and that is fabricated in a relatively simple process.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a semiconductor substrate having opposite front and rear surfaces; a semiconductor element disposed on the front surface of the semiconductor substrate and including an electrode; a plated heat sink (hereinafter referred to as a PHS) comprising a metal layer and disposed on the rear surface of the semiconductor substrate, the PHS dissipating heat produced in the semiconductor device; a via-hole comprising a through-hole penetrating through the semiconductor substrate from the front surface to the rear surface and having an inner surface, and a metal disposed in the through-hole and contacting the PHS; and a first wiring comprising a metal film and having first and second portions, the first wiring contacting the electrode of the semiconductor element at the first portion and contacting the metal of the via-hole at the second portion. Therefore, heat produced in the semiconductor element is transferred to the PHS not only through the semiconductor substrate just under the element but also through the first wiring and the via-hole, whereby the heat dissipation property of the device is significantly improved. Further, the first wiring, the via-hole, and the PHS are made of metals having relatively low thermal resistances, and the semiconductor substrate having a relatively high thermal resistance is not interposed between them. So, the thermal resistance of the heat transfer path comprising the first wiring, the via-hole, and the PHS is low. As a result, unwanted increase in the temperature of the element is suppressed, whereby degradation of electrical characteristics of the element is avoided.

According to a second aspect of the present invention, in the above-described semiconductor device, the first wiring is an air-bridge wiring. Therefore, in addition to improving the heat dissipation property, the parasitic capacitance of the wiring is reduced, whereby the high-frequency characteristics of the device is improved.

According to a third aspect of the present invention, in the above-described semiconductor device, the semiconductor element is a bipolar transistor, and the electrode is an emitter electrode. Therefore, even in a high power density element, such as bipolar transistor, heat produced in the bipolar transistor is transferred through the emitter electrode to the air-bridge wiring, improving the heat dissipation property. As a result, the junction temperature of the bipolar transistor is suppressed, whereby degradation of electrical characteristics of the bipolar transistor is avoided.

According to a fourth aspect of the present invention, in the above-described semiconductor device, the semiconductor element is a bipolar transistor, and the electrode is a base electrode. Therefore, even in a high power density element, such as bipolar transistor, heat produced in the bipolar transistor is transferred through the base electrode to the air-bridge wiring, improving the heat dissipation property. As a result, the junction temperature of the bipolar transistor is suppressed, whereby degradation of electrical characteristics of the bipolar transistor is avoided.

According to a fifth aspect of the present invention, in the above-described semiconductor device, since the base electrode of the bipolar transistor is grounded, the power gain in the high-frequency band is increased, whereby the output power and the power addition efficiency are increased.

According to a sixth aspect of the present invention, in the above-described semiconductor device, the second portion of the air-bridge wiring is directly connected to the via-hole metal. In this structure, since nothing interposes between the air-bridge wiring and the via-hole metal, the heat resistance from the electrode of the element to the PHS is suppressed. As a result, unwanted increase in the temperature of the element is suppressed, whereby degradation of electrical characteristics of the element is avoided.

According to a seventh aspect of the present invention, in the above-described semiconductor device, a second wiring is disposed on the front surface of the semiconductor substrate in close vicinity to the via-hole, and the second portion of the air-bridge wiring and the via-hole metal are connected to the second wiring. Therefore, the air-bridge wiring and the via-hole metal can be produced in different process steps, and it is possible to optimize materials and shapes thereof so that the best heat dissipation property, electrical characteristics, and reliability are realized.

According to an eighth aspect of the present invention, in the above-described semiconductor device, the via-hole metal is a metal film disposed on the inner surface of the through-hole. This via-hole metal film is produced in relatively simple and stable process. In addition, it is possible to unite the via-hole metal film with the air-bridge wiring as described in the following.

According to a ninth aspect of the present invention, in the above-described semiconductor device including the via-hole with a metal film on the inner surface, the via-hole metal film and the metal film of the air-bridge wiring comprise the same material and are formed as a continuous metal layer. Therefore, there is no junction between the via-hole metal and the air-bridge wiring, so that the reliability is improved as compared to a structure having such junction. In addition, since it is not necessary to secure a space for the junction, the via-hole is located in close vicinity to the semiconductor element, so that the length of the air-bridge wiring connecting the electrode of the element to the via-hole is shortened. Consequently, the thermal resistance is reduced by the reduction in the air-bridge length, and the inductance of the air-bridge is reduced. As a result, unwanted increase in the temperature of the element is suppressed, whereby degradation in electrical characteristics of the element is avoided.

According to a tenth aspect of the present invention, in the above-described semiconductor device, the via-hole metal is a metal filling the through-hole. Therefore, the thermal resistance of the via-hole is reduced as compared to the above-described via-hole with a metal film on the inner surface. Consequently, the thermal resistance from the electrode of the element to the PHS is reduced. As a result, unwanted increase in the temperature of the element is suppressed, whereby degradation in electrical characteristics of the element is avoided.

According to an eleventh aspect of the present invention, in the above-described semiconductor device including the via-hole filled with metal, a via-hole upper electrode comprising a metal film is disposed on a region of the front surface of the semiconductor substrate including an upper opening of the via-hole, and the lower surface of the via-hole upper electrode contacts the via-hole metal while the upper surface thereof contacts the second portion of the air-bridge wiring. Therefore, the adhesion between the via-hole upper electrode and the air-bridge wiring or the via-hole metal is improved by optimizing the material and the structure of the via-hole upper electrode.

According to a twelfth aspect of the present invention, in the above-described semiconductor device, a plurality of semiconductor elements are arranged in an array on the front surface of the semiconductor substrate. In this structure, when the above-described via-hole is located in close vicinity to each semiconductor element and the electrode of the semiconductor element is connected to the via-hole with the above-described air-bridge wiring, the heat dissipation property of the semiconductor element is significantly improved. As a result, unwanted increase in the temperature of the element is suppressed, whereby degradation in electrical characteristics of the element is avoided.

According to a thirteenth aspect of the present invention, in the above-described semiconductor device including the array of semiconductor elements, the via-hole is located at positions arbitrarily selected from positions on both sides of the array of the semiconductor elements and positions between the semiconductor elements. Therefore, the via-hole is located in close vicinity to the semiconductor element. In the prior art structure shown in FIG. 26, heat generated in each element is conducted through the long air-bridge wiring from the element to an end of the array of the elements. In the structure according to the invention, however, the heat conducting distance through the air-bridge wiring is as short as the distance from the element to the via-hole adjacent to the element. Therefore, the heat dissipation property of each semiconductor element is significantly improved compared to the prior art structure. As a result, unwanted increase in the temperature of the element is suppressed, whereby degradation in electrical characteristics of the element is avoided. Further, since the heat conducting distance is short as described above, even when the thickness of the air-bridge wiring is reduced, the thermal resistance of the air-bridge wiring is sufficiently reduced. The reduction in the thickness facilitates the fabrication of the air-bridge wiring. Further, the reduction in the length of the air-bridge wiring from the electrode of the element to the via-hole results in a reduction in the inductance of the air-bridge wiring, whereby the high frequency characteristics of the element are improved. When the via-hole is located at every position between the semiconductor elements, the heat dissipation property is further improved and the thermal resistances of the semiconductor elements are made uniform, as compared to the case where the via-hole is located at arbitrarily selected positions between the semiconductor elements. Further, since the via-hole is present between adjacent elements, the thermal separation between the elements is improved, whereby unwanted increase in the temperature of the elements in the middle of the array is suppressed.

According to a fourteenth aspect of the present invention, in the above-described semiconductor device, the width of the via-hole in the direction perpendicular to the array direction of the semiconductor elements is larger than the width of the heat generating region of the semiconductor element. Therefore, a great part of heat diffusing from the semiconductor element adjacent to the via-hole toward the surface of the semiconductor substrate is absorbed by the via-hole, whereby the thermal separation between the semiconductor elements on both sides of the via-hole is improved. Consequently, unwanted increase in the temperature of the elements in the middle of the array is suppressed.

According to a fifteenth aspect of the present invention, in the above-described semiconductor device, heat dissipating metal films are disposed on the front surface of the semiconductor substrate in regions on the both sides of the array of the semiconductor elements and between the semiconductor elements where the via-holes are absent, and the heat dissipating metal film contacts the second portion of the air-bridge wiring. Therefore, the heat dissipation property is improved as compared to a case where no heat dissipating metal film is disposed in regions where the via-holes are absent. Consequently, unwanted increase in the temperature of the element is suppressed, whereby degradation of electrical characteristics of the element is avoided.

According to a sixteenth aspect of the invention, in the above-described semiconductor device, the via-hole is formed in a shape that surrounds the semiconductor element leaving a region of the substrate where the substrate under the semiconductor element is connected to the substrate outside the via-hole. Therefore, heat diffusing from the semiconductor element surrounded by the via-hole toward the surface of the semiconductor substrate is absorbed by the via-hole, so that the thermal separation between the elements on both sides of the via-hole is significantly improved. Consequently, unwanted increase in the temperature of the elements in the middle of the array is suppressed.

According to a seventeenth aspect of the invention, a semiconductor device comprises a semiconductor substrate having opposite front and rear surfaces; a plurality of semiconductor elements disposed on the front surface of the semiconductor substrate in an array, each semiconductor element including an electrode; heat dissipating metal films disposed on the front surface of the semiconductor substrate at positions arbitrarily selected from positions on both sides of the array of the semiconductor elements and positions between the semiconductor elements; and a wiring having first portions and second portions, contacting the electrodes of the semiconductor elements at the first portions and contacting the heat dissipating metal films at the second portions. Therefore, the heat dissipation property is improved as compared to the prior art structure having heat dissipating regions only on the both sides of the array of the semiconductor elements. When the area of the heat dissipating metal film is increased, the heat dissipation property of the element is improved to an extent achieved by the via-hole. Thereby, unwanted increase in the temperature of the element is suppressed, whereby degradation of electrical characteristics of the element is avoided. Since this heat dissipating metal film can be located in close vicinity to the semiconductor element, the length of the wiring connecting the electrode of the element to the metal film is shortened. The reduction in the wiring length contributes to improvement in the heat dissipation property and reduction in the inductance of the wiring.

According to an eighteenth aspect of the present invention, in the above-described semiconductor device, the wiring is an air-bridge wiring, the parasitic resistance of the wiring is reduced, whereby the high-frequency characteristics of the device are improved.

According to a nineteenth aspect of the present invention, in the above-described semiconductor device, the semiconductor elements are bipolar transistors, and the electrode of each bipolar transistor is an emitter electrode. Since the heat dissipating metal film is disposed in close vicinity to the bipolar transistor, the length of the wiring connecting the metal film and the emitter electrode is shortened. Therefore, the heat dissipation property is improved, and the inductance of the wiring is reduced.

According to a twentieth aspect of the present invention, in the above-described semiconductor device, the semiconductor elements are bipolar transistors, and the electrode of each bipolar transistor is a base electrode. Since the heat dissipating metal film is disposed in close vicinity to the bipolar transistor, the length of the wiring connecting the metal film and the base electrode is shortened. Therefore, the heat dissipation property is improved, and the inductance of the wiring is reduced.

According to a twenty-first aspect of the present invention, in the above-described semiconductor device, since the base electrode of the bipolar transistor is grounded, the power gain in high-frequency band is increased, whereby the output power and the power addition efficiency of the device are increased.

According to a twenty-second aspect of the present invention, in the semiconductor device according to the first aspect, the semiconductor element is a bipolar transistor including an emitter electrode having opposite first and second sides, a collector electrode disposed on the first side of and spaced apart from the emitter electrode, and a first base electrode disposed on the second side of and spaced apart from the emitter electrode. The electrode contacting the first wiring is the first base electrode. The first wiring and the via-hole metal is a continuous metal layer, and the via-hole is disposed on the second side of the emitter electrode and adjacent to the first base electrode. In this structure, since heat generated in the bipolar transistor is transferred to the PHS not only through the substrate just under the bipolar transistor but also through the wiring and the via-hole, the heat dissipation property is significantly improved. Further, since the wiring, the via-hole, and the PHS comprise metals of low thermal resistivity, and the semiconductor substrate having relatively high thermal resistivity is not interposed between them, the thermal resistance is reduced. Therefore, unwanted increase in the temperature of the device is suppressed, whereby degradation of electrical characteristics of the device is avoided and the output power and the power addition efficiency of the device are improved.

According to a twenty-third aspect of the present invention, the above-described semiconductor device further includes a second base electrode disposed in a region between the emitter electrode and the collector electrode and electrically connected to the first base electrode. Therefore, the base resistance is reduced, whereby the high-frequency characteristics of the device is further improved.

According to a twenty-fourth aspect of the present invention, a method of fabricating a semiconductor device comprises preparing a semiconductor substrate having opposite front and rear surfaces; producing a semiconductor element including an electrode on the front surface of the semiconductor substrate; forming a hole having a prescribed depth and an inner surface in a region of the semiconductor substrate in close vicinity to the semiconductor element; producing a metal layer on the inner surface of the hole; producing an air-bridge wiring having first and second portions, contacting the electrode of the semiconductor element at the first portion and contacting the metal layer in the hole at the second portion; grinding and polishing the semiconductor substrate at the rear surface until the metal layer in the hole is exposed, thereby producing a via-hole; and producing a plated heat sink for heat dissipation on the rear surface of the semiconductor substrate, contacting the metal layer of the via-hole. Therefore, heat produced in the semiconductor element is transferred to the PHS not only through the semiconductor substrate just under the element but also through the air-bridge wiring and the via-hole, whereby the heat dissipation property of the device is significantly improved. Further, the air-bridge wiring, the via-hole, and the PHS are made of metals having relatively low thermal resistances, and the semiconductor substrate having a relatively high thermal resistance is not interposed between them. So, the thermal resistance of the heat transfer path comprising the air-bridge wiring, the via-hole, and the PHS is low. Since the via-hole is located in close vicinity to the semiconductor element, the distance from the electrode of the element to the via-hole is short, so that the length of the air-bridge wiring connecting the electrode to the via-hole is short, resulting in a reduction in the thermal resistance. Consequently, unwanted increase in the temperature of the element is suppressed, whereby degradation in electrical characteristics of the element is avoided. Further, the reduction in the air-bridge length results in a reduction in the inductance of the air-bridge wiring. Furthermore, since the air-bridge wiring is short, the thickness of the air-bridge wiring can be reduced, whereby the fabrication of the air-bridge wiring is facilitated.

According to a twenty-fifth aspect of the present invention, in the above-described method of fabricating a semiconductor device, the via-hole metal layer and the air-bridge wiring are produced simultaneously in the same process step using the same material. That is, the via-hole metal layer and the air-bridge wiring are formed as a continuous layer, and there is no junction between the via-hole metal layer and the air-bridge wiring. Therefore, the reliability is improved as compared to a structure having such junction. In addition, since it is not necessary to secure a space for the junction, the via-hole can be located in close vicinity to the semiconductor element, so that the length of the air-bridge wiring connecting the element to the via-hole is shortened. Consequently, the thermal resistance is reduced by the reduction in the air-bridge length, and the inductance of the air-bridge wiring is reduced. Furthermore, since the air-bridge wiring and the via-hole metal layer are formed simultaneously in the same process step, the process is facilitated.

According to a twenty-sixth aspect of the present invention, in the above-described method of fabricating a semiconductor device, after the formation of the semiconductor element and before the formation of the via-hole metal layer and the air-bridge wiring, a wiring metal film is deposited on a region of the surface of the semiconductor substrate adjacent to the region where the via-hole is later produced. The via-hole metal layer is formed contacting the wiring metal film, and the air-bridge wiring is formed contacting the wiring metal film at the second portion. In this method, since the via-hole metal layer and the air-bridge wiring are formed in different process steps, it is possible to optimize materials and shapes thereof so that the best heat dissipation property, electrical characteristics, and reliability are realized. In addition, process steps for stably producing the via-hole metal layer and the air-bridge wiring, respectively, can be employed, the reliability of the device and the production yield are improved. Furthermore, since the wiring metal film is located in close vicinity to the semiconductor element, the length of the air-bridge wiring connecting the electrode of the element to the wiring is shortened. Therefore, as already described above, the thickness of the air-bridge wiring can be reduced, and the electroplating of the air-bridge wiring is facilitated.

According to a twenty-seventh aspect of the present invention, a method of fabricating a semiconductor device including preparing a semiconductor substrate having opposite front and rear surfaces; producing a semiconductor element including an electrode on the front surface of the semiconductor substrate; depositing a metal film on the front surface of the semiconductor substrate including a region where a via-hole is later produced, thereby producing a via-hole upper electrode; producing an air-bridge wiring having first and second portions, contacting the electrode of the semiconductor element at the first portion and contacting the via-hole upper electrode at the second portion; grinding and polishing the semiconductor substrate at the rear surface; forming a hole penetrating through the semiconductor substrate by etching away a portion of the semiconductor substrate from the rear surface until the via-hole upper electrode is exposed; and plating a metal to the rear surface of the substrate including the inner surface of the through-hole, thereby producing a via-hole completely filled with the plated metal, and a plated heat sink comprising the plated metal. Therefore, the thermal resistance of the via-hole is reduced as compared to the above-described structure where the via-hole metal is a metal film, whereby the thermal resistance from the electrode of the element to the PHS is reduced. In addition, the adhesion between the via-hole upper electrode and the air-bridge wiring or the via-hole metal is improved by optimizing the material and the structure of the via-hole upper electrode. Further, since the via-hole metal and the PHS are formed simultaneously in the same process step, the process is facilitated. Likewise, since the via-hole metal is united with the PHS, there is no junction between them, so that the reliability is improved compared to a structure having such junction. Furthermore, because the connection between the via-hole upper electrode and the air-bridge wiring is carried out in a region on the via-hole, it is not necessary to secure a space for the connection. Therefore, the via-hole is formed in close vicinity to the semiconductor element, so that the length of the air-bridge wiring connecting the electrode of the element to the via-hole is shortened. As a result, the heat dissipation property is improved, the inductance of the air-bridge wiring is reduced, and the thickness of the air-bridge wiring is reduced.

According to a twenty-eighth aspect of the present invention, in the above-described method of fabricating a semiconductor device, before the formation of the air-bridge wiring, a metal film is deposited on a region of the front surface of the semiconductor substrate to produce a heat dissipating metal film and, thereafter, the air-bridge wiring is produced contacting the electrode of the semiconductor element at the first portion and contacting the heat dissipating metal film at the second portion. Therefore, when this heat dissipating metal film is formed in a region where the via-hole is absent, heat produced in the semiconductor element is dissipated through this metal film, whereby the heat dissipation property is improved. In addition, since the connection between the heat dissipating metal film and the air-bridge wiring is carried out on the heat dissipating metal film, it is not necessary to secure a space for the connection only. Therefore, the heat dissipating metal film is formed in close vicinity to the element, so that the length of the air-bridge wiring is shortened. As already described above, the reduction in the air-bridge length results in a reduction in the thermal resistance and a reduction in the inductance of the air-bridge wiring. Furthermore, since the air-bridge wiring is short, the thickness of the air-bridge wiring can be reduced, whereby the electroplating of the air-bridge wiring is facilitated.

According to a twenty-ninth aspect of the present invention, a method of fabricating a semiconductor device including preparing a semiconductor substrate having a surface; fabricating a plurality of semiconductor elements on the surface of the semiconductor substrate in an array, each element having an electrode; forming a plurality of heat dissipating metal films on the surface of the semiconductor substrate at positions adjacent to arbitrarily selected ones of the semiconductor elements; and forming an air-bridge wiring having first portions and second portions so that the first portions contact the electrodes of the semiconductor elements and the second portions contact the heat dissipating metal films. Therefore, the heat dissipation property is improved as compared to the prior art structure shown in FIG. 26 having the heat dissipating regions only on the both sides of the array of the elements. Further, since the connection between the heat dissipating metal film and the air-bridge wiring is carried out on the heat dissipating metal film, it is not necessary to secure a space for the connection only. Therefore, the heat dissipating metal film is formed in close vicinity to the element, so that the length of the air-bridge wiring is shortened. As already described above, the reduction in the air-bridge length results in a reduction in the thermal resistance and a reduction in the inductance of the air-bridge wiring. Furthermore, since the air-bridge wiring is short, the thickness of the air-bridge wiring can be reduced, whereby the electroplating of the air-bridge wiring is facilitated.

According to a thirtieth aspect of the present invention, a method of fabricating a semiconductor device comprising preparing a semiconductor substrate having opposite front and rear surfaces; producing a bipolar transistor on the front surface of the semiconductor substrate, the bipolar transistor including an emitter electrode having opposite first and second sides, a collector electrode disposed on the first side of and spaced apart from the emitter electrode, and a first base electrode disposed on the second side of and spaced apart from the emitter electrode; forming a hole having a prescribed depth in a region of the semiconductor substrate on the side of the base electrode opposite from the emitter electrode and in close vicinity to the base electrode; producing a metal layer on the inner surface of the hole and on a region of the substrate between the first base electrode of the bipolar transistor and the hole, contacting the first base electrode; grinding and polishing the semiconductor substrate at the rear surface until the metal layer in the hole is exposed, thereby producing a via-hole; and producing a plated heat sink for heat dissipation on the rear surface of the semiconductor substrate, contacting the metal layer of the via-hole. Therefore, heat produced in the bipolar transistor is transferred to the PHS not only through the semiconductor substrate just under the transistor but also through the air-bridge wiring and the via-hole, whereby the heat dissipation property of the transistor is significantly improved.

Further, the via-hole and the PHS are made of metals having relatively low thermal resistances, and the semiconductor substrate having a relatively high thermal resistance is not interposed between them. So, the thermal resistance of the heat transfer path comprising the via-hole and the PHS is low. Since the via-hole is located in close vicinity to the bipolar transistor, the distance from the base electrode of the transistor to the via-hole is short, resulting in a reduction in the thermal resistance. Consequently, unwanted increase in the temperature of the transistor is suppressed, whereby degradation in electrical characteristics of the device is avoided. Further, since the distance between the base electrode and the via-hole is short, the inductance of the metal layer connecting them is reduced. Since the metal layer is formed simultaneously with the via-hole metal and, furthermore, it is directly deposited on the substrate, i.e., it is not an air-bridge, the fabricating process is simplified.

According to a thirty-first aspect of the present invention, in the above-described fabricating method of the bipolar transistor, the bipolar transistor further includes a second base electrode formed in a region between the emitter electrode and the collector electrode and electrically connected to the first base electrode. Therefore, the base resistance is reduced, whereby the high-frequency characteristics of the transistor are further improved.

According to a thirty-second aspect of the present invention, a semiconductor device including a semiconductor substrate having opposite front and rear surfaces; an electric resistance structure comprising an electric resistor disposed on the front surface of the substrate and having opposite first and second ends, a first conductive wiring contacting the first end of the electric resistance at a part, and a second conductive wiring contacting the second end of the electric resistance at a part; and a heat conducting structure disposed in close vicinity to the electric resistance structure and comprising the first wiring, the second wiring, and an inter-wiring insulating film disposed between the first wiring and the second wiring and electrically insulating the first wiring and the second wiring from each other. In the heat conducting structure, the thermal resistance of the heat conducting path through the inter-wiring insulating film between the first wiring and the second wiring is lower than the thermal resistance of the heat conducting path through the electric resistor between parts of the first and second wirings contacting the electric resistor. In this structure, between the first wiring and the second wiring, heat flows through the heat conducting structure and current flows through the electric resistance structure. When the thickness of the inter-wiring insulating film is reduced within a range in which the electrical insulation between the first wiring and the second wiring is not degraded while maintaining a sufficient area of a region where the first wiring and the second wiring overlap each other with the inter-wiring insulating film between them, the thermal resistance of the heat conducting structure is sufficiently lower than the thermal resistance of the electric resistance structure. Therefore, even when the electric resistor is connected between the first wiring and the second wiring in series, increase in the thermal resistance due to the electric resistor is suppressed. That is, a semiconductor device with appropriate electric resistance and favorable heat conducting property is realized.

According to a thirty-third aspect of the present invention, in the above-described semiconductor device, an insulating film is disposed on the electric resistance structure, and the heat conducting structure is disposed on the insulating film. Therefore, even when the electric resistor is inserted between the first wiring and the second wiring, increase in the thermal resistance due to the resistor is suppressed. In addition, since the heat conducting structure is located on the electric resistance structure, the area of the semiconductor device on the semiconductor substrate is reduced.

According to a thirty-fourth aspect of the present invention, in the above-described semiconductor device, the first wiring and the second wiring have high adhesion to the electric resistor, and the first wiring and the second wiring are connected to the electric resistor through a first contact electrode and a second contact electrode both comprising a material that makes an ohmic contact with the electric resistor, respectively. In this structure, the thermal resistance of the heat conducting path through the inter-wiring insulating film between the first and second wirings is lower than the thermal resistance of the heat conducting path through first contact electrode, the electric resistor, and the second contact electrode between parts of the first and second wirings contacting the first and second contact electrodes, respectively. Therefore, even when the electric resistor is inserted between the first wiring and the second wiring, increase in the thermal resistance due to the resistor is suppressed. In addition, the contact resistance between the wiring and the electric resistor is reduced, and the reliability of the electrical contact between them is improved.

According to a thirty-fifth aspect of the present invention, in the above-described semiconductor device, the electric resistor is a thin metal film disposed on the front surface of the semiconductor substrate. Therefore, even when the electric resistor is inserted between the first wiring and the second wiring, increase in the thermal resistance due to the resistor is suppressed. In addition, the electric resistance of the electric resistance structure can be accurately controlled.

According to a thirty-sixth aspect of the present invention, in the above-described semiconductor device, an insulating film is interposed between the electric resistor comprising a thin metal film and the front surface of the semiconductor substrate. Therefore, even when the electric resistor is inserted between the first wiring and the second wiring, increase in the thermal resistance due to the resistor is suppressed. In addition, the electric resistance of the electric resistance structure is accurately controlled. Further, since the electric resistor is insulated from the semiconductor substrate by the insulating film, unwanted interaction between the electric resistor and other elements on the semiconductor substrate through the semiconductor substrate is avoided, resulting in a semiconductor device operating with high stability.

According to a thirty-seventh aspect of the present invention, in the above-described semiconductor device, the electric resistor is a conductive semiconductor region produced within the semiconductor substrate by adding a dopant impurity of a conductivity type to the substrate from the front surface. Therefore, even when the electric resistor is inserted between the first wiring and the second wiring, increase in the thermal resistance due to the resistor is suppressed. In addition, the electric resistance of the electric resistance structure is easily controlled in a wide range by controlling the dopant concentration of the semiconductor region serving as the electric resistor.

According to a thirty-eighth aspect of the present invention, in the above-described semiconductor device, the electric resistor is a conductive semiconductor layer produced by growing a semiconductor containing a dopant impurity of a conductivity type on the front surface of the semiconductor substrate. Therefore, even when the electric resistor is inserted between the first wiring and the second wiring, increase in the thermal resistance due to the resistor is suppressed. In addition, the electric resistance of the electric resistance structure is easily controlled in a wide range by controlling the dopant concentration of the semiconductor layer serving as the electric resistor.

According to a thirty-ninth aspect of the present invention, in the above-described semiconductor device, the semiconductor substrate comprises a semi-insulating semiconductor. Therefore, the electrical separation between the electric resistor and other elements on the substrate is facilitated.

According to a fortieth aspect of the present invention, the above-described semiconductor device further includes a semiconductor element is disposed on the front surface of the semiconductor substrate and having an electrode; a plated heat sink for dissipating heat generated in the semiconductor element, the plated heat sink comprising a metal layer disposed on the rear surface of the semiconductor substrate; and a via-hole comprising a hole penetrating through the semiconductor substrate from the front surface to the rear surface and having an inner surface and a metal layer disposed on the inner surface of the through-hole, the metal layer contacting a part of the second wiring other than the part contacting the electric resistor and contacting the plated heat sink, wherein the first wiring is an air-bridge wiring contacting the electrode of the semiconductor element at a part other than the part contacting the electric resistor. Therefore, even when the electric resistor is inserted between the first wiring and the second wiring, increase in the thermal resistance due to the resistor is suppressed. As a result, appropriate electric resistance and favorable heat dissipation property are realized between the electrode of the semiconductor element and the PHS.

According to a forty-first aspect of the present invention, in the above-described semiconductor device, a plurality of semiconductor elements are arranged in an array on the front surface of the semiconductor substrate, and a plurality of via-holes are located at positions arbitrarily selected from positions on both sides of the array of the semiconductor elements and positions between the semiconductor elements. Therefore, even when the electric resistor is inserted between the first wiring and the second wiring, increase in the thermal resistance due to the resistor is suppressed. As a result, between the electrode of the semiconductor element and the PHS that is usually at ground voltage, appropriate electric resistance and favorable heat dissipation property are realized. Further, since the via-hole is located in close vicinity to each of the semiconductor elements, the distance between the electrode of the semiconductor element to the via-hole is reduced, whereby the heat dissipation property between them is improved.

According to a forty-second aspect of the present invention, in the above-described semiconductor device, the semiconductor element is a bipolar transistor, and the electrode is an emitter electrode. Therefore, even when the electric resistor is inserted between the first wiring and the second wiring, increase in the thermal resistance due to the resistor is suppressed. As a result, between the emitter electrode of the bipolar transistor element and the PHS that is usually at ground voltage, appropriate electric resistance and favorable heat dissipation property are realized. When emitter electrodes of plural bipolar transistors are connected to the PHS, unwanted concentration of current to particular bipolar transistor having emitter-base resistance lower than that of other bipolar transistors is prevented by using the electric resistor as a ballast resistor.

According to a forty-third aspect of the present invention, the above-described semiconductor device, the semiconductor element is a bipolar transistor, and the electrode is a base electrode. Therefore, even when the electric resistor is inserted between the first wiring and the second wiring, increase in the thermal resistance due to the resistor is suppressed. As a result, between the base electrode of the bipolar transistor and the PHS that is usually at ground voltage, appropriate electric resistance and favorable heat dissipation property are realized. When base electrodes of plural bipolar transistors are connected to the PHS, unwanted concentration of current to particular transistor having emitter-base resistance lower than that of other transistors is prevented by using the electric resistor as a ballast resistor.

According to a forty-fourth aspect of the present invention, a method of fabricating a semiconductor device comprising preparing a semiconductor substrate having opposite front and rear surfaces; producing an electric resistor having opposite first and second ends on the front surface of the semiconductor substrate; producing a resistor covering insulating film on the electric resistor so that the opposite ends of the electric resistor are exposed; producing a first contact electrode and a second contact electrode both comprising a material that has a good adhesion to the electric resistor and makes an ohmic contact with the electric resistor, the first and second contact electrodes being separated from each other, and the first contact electrode contacting the first end of the electric resistor while the second contact electrode contacting the second end of the electric resistor; producing a first wiring comprising a conductive material, contacting the first contact electrode at a part; producing an inter-wiring insulating film on a prescribed region of the first wiring where a second wiring is later produced, the region including a heat conducting region in which heat is conducted through the inter-wiring insulating film between the first and second wirings; and producing a second wiring comprising a conductive material on a region of the semiconductor substrate including the heat conducting region so that it does not contact the first wiring but contacts the second contact electrode at a part, thereby producing an electric resistance structure comprising the first wiring, the first contact electrode, the electric resistor, the second contact electrode, and the second wiring, and a heat conducting structure comprising the first wiring, the inter-wiring insulating film, and the second wiring wherein thermal resistance of a first heat conducting path through the inter-wiring insulating film between the first and second wirings is lower than thermal resistance of a second heat conducting path through the first contact electrode, the electric resistor, and the second contact electrode between the parts of the first and second wirings respectively connected to the first and second contact electrodes. Therefore, in a semiconductor device fabricated by the above-described method, between the first wiring and the second wiring, heat flows through the heat conducting structure and current flows through the electric resistance structure. When the thickness of the inter-wiring insulating film is reduced within a range in which the electrical insulation between the first wiring and the second wiring is not degraded while maintaining a sufficient area of a region where the first wiring and the second wiring overlap each other with the inter-wiring insulating film between them, the thermal resistance of the heat conducting structure is sufficiently lower than the thermal resistance of the electric resistance structure. Therefore, even when the electric resistor is connected between the first wiring and the second wiring in series, increase in the thermal resistance due to the electric resistor is suppressed. That is, a semiconductor device with appropriate electric resistance and favorable heat conducting property is realized. Furthermore, since the heat conducting structure is located on electric resistance structure, the area of the semiconductor device on the semiconductor substrate is reduced. Furthermore, the first contact electrode and the second contact electrode are disposed between the first wiring and the electric resistor and between the electric resistor and the second wiring, respectively, contact resistances between the respective wirings and the electric resistor are reduced, and the reliability of electrical connection between the wirings and the electric resistor is improved.

According to a forty-fifth aspect of the present invention, in the above-described method of fabricating a semiconductor device, the electric resistor is produced by depositing a thin metal film on a prescribed part of the front surface of the semiconductor substrate. Therefore, even when the electric resistor is inserted between the first wiring and the second wiring, increase in the thermal resistance due to the resistor is suppressed. In addition, the electric resistance of the electric resistance structure can be precisely controlled.

According to a forty-sixth aspect of the present invention, in the method of fabricating a semiconductor device, before the deposition of the thin metal film serving as the electric resistor, a substrate protecting insulating film is formed on a prescribed part of the front surface of the semiconductor substrate and, thereafter, the thin metal film is deposited on a prescribed part of the substrate protecting insulating film. Therefore, even when the electric resistor is inserted between the first wiring and the second wiring, increase in the thermal resistance due to the resistor is suppressed. In addition, the electric resistance of the electric resistance structure can be accurately controlled. Further, since the electric resistor is insulated from the semiconductor substrate by the insulating film, unwanted interaction between the electric resistor and other elements on the semiconductor substrate through the semiconductor substrate is avoided, resulting in a semiconductor device operating with high stability.

According to a forty-seventh aspect of the present invention, in the above-described method of fabricating a semiconductor device, before formation of the electric resistor, a semiconductor element having an electrode is fabricated on the front surface of the semiconductor substrate, and the first wiring is produced contacting the electrode of the semiconductor element at a first portion and contacting the first contact electrode at a second portion other than the first portion, thereby producing an air-bridge wiring comprising a conductive material. After formation of the inter-wiring insulating film and before formation of the second wiring, a hole having a prescribed depth and an inner surface is formed in a region of the semiconductor substrate where a via-hole is later produced, and the second wiring is produced by depositing a metal film on a prescribed region including the heat conducting region on the inter-wiring insulating film and the inner surface of the hole, contacting the second contact electrode at a part, without contacting the first wiring. After formation of the second wiring, the semiconductor substrate is ground and polished at the rear surface until a portion of the second wiring at the bottom of the hole is exposed, thereby producing a via-hole. Finally, a plated heat sink comprising a metal layer and dissipating heat generated in the semiconductor element is produced on the rear surface of the semiconductor substrate, contacting a portion of the second wiring in the via-hole. Therefore, even when the electric resistor is inserted between the first wiring and the second wiring, increase in the thermal resistance due to the resistor is suppressed. As a result, appropriate electric resistance and favorable heat dissipation property are realized between the electrode of the semiconductor element and the PHS. Further, since the electric resistor comprises a thin metal film, the electric resistance of this resistor can be precisely controlled.

According to a forty-eighth aspect of the present invention, in the above-described method of fabricating a semiconductor device, the electric resistor is fabricated by forming a conductive semiconductor region in a prescribed region of the semiconductor substrate by adding a dopant impurity of a conductivity type to the substrate from the front surface. Therefore, even when the electric resistor is inserted between the first wiring and the second wiring, increase in the thermal resistance due to the resistor is suppressed. In addition, the electric resistance of the electric resistance structure is easily controlled in a wide range by controlling the dopant concentration of the conductive semiconductor region serving as the electric resistor.

According to a forty-ninth aspect of the present invention, the above-described method of fabricating a semiconductor device further includes fabricating a semiconductor element including an electrode on the front surface of the semiconductor substrate, and the electric resistor, i.e., the conductive semiconductor region within the substrate, is produced during the fabrication of the semiconductor element. The first wiring is produced contacting the electrode of the semiconductor element at a first portion and contacting the first contact electrode at a second portion other than the first portion, thereby producing an air-bridge wiring comprising a conductive material. After formation of the inter-wiring insulating film and before formation of the second wiring, a hole having a prescribed depth and an inner surface is formed in a region of the semiconductor substrate where a via-hole is later produced, and the second wiring is produced by depositing a metal film on a prescribed region including the heat conducting region on the inter-wiring insulating film and the inner surface of the hole, contacting the second contact electrode at a part, without contacting the first wiring. After formation of the second wiring, the semiconductor substrate is ground and polished at the rear surface until a portion of the second wiring at the bottom of the hole is exposed, thereby producing a via-hole. Finally, a plated heat sink comprising a metal layer and dissipating heat generated in the semiconductor element is produced on the rear surface of the semiconductor substrate, contacting a portion of the second wiring in the via-hole. Therefore, even when the electric resistor is inserted between the first wiring and the second wiring, increase in the thermal resistance due to the resistor is suppressed. As a result, appropriate electric resistance and favorable heat dissipation property are realized between the electrode of the semiconductor element and the PHS. Further, the electric resistance of the electric resistance structure is easily controlled in a wide range by controlling the dopant concentration of the conductive semiconductor region serving as the electric resistor. Furthermore, the fabrication of the electric resistor by adding the dopant impurity into the front surface of the semiconductor substrate is carried out during the fabrication of the semiconductor element, the fabricating process is simplified compared to the above-described method in which the electric resistor is fabricated by depositing a thin metal film.

According to a fiftieth aspect of the present invention, in the above-described method of fabricating a semiconductor device, the electric resistor is fabricated by growing a semiconductor containing a dopant impurity of a conductivity type on the front surface of the semiconductor substrate. Therefore, even when the electric resistor is inserted between the first wiring and the second wiring, increase in the thermal resistance due to the resistor is suppressed. In addition, the electric resistance of the electric resistance structure is easily controlled in a wide range by controlling the dopant concentration of the semiconductor layer serving as the electric resistor.

BRIEF DESCRIPTION OF THE DRAWINGS

FIGS. 4(a)–4(e) are cross-sectional views illustrating process steps in a method of fabricating the HBT shown in FIG. 2.

FIGS. 13(a)–13(e) are cross-sectional views illustrating process steps in a method of fabricating the HBT shown in FIG. 12.

DETAILED DESCRIPTION OF THE PREFERRED EMBODIMENTS

[Embodiment 1]

Figure 1:
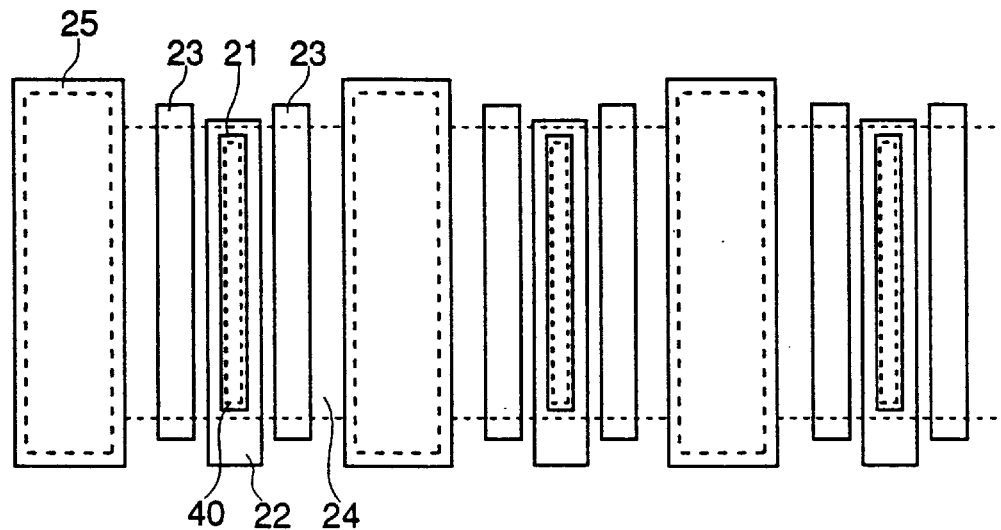
FIG. 1 is a plan view illustrating an HBT in accordance with a first embodiment of the present invention.
Figure 2:
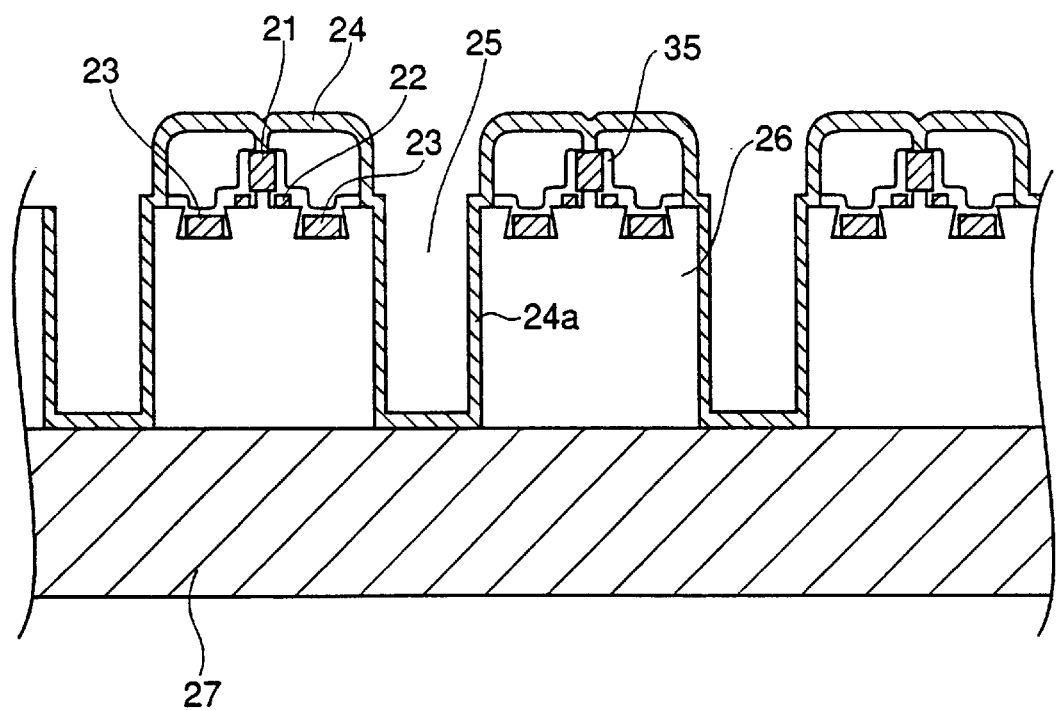
FIG. 2 is a cross-sectional view of the HBT shown in FIG. 1.

FIG. 1 is a plan view illustrating an HBT in accordance with a first embodiment of the present invention. In FIG. 1, a plurality of HBT elements, i.e., unit elements, and a plurality of via-holes 25 are alternatingly arranged in an array. Each HBT element includes an emitter electrode comprising AuGe(50 nm)/Ni(50 nm)/Au(300 nm), a base electrode 22 comprising Ti(50 nm)/Mo(50 nm)/Au(350 nm), and collector electrodes 23 comprising AuGe(50 nm)/Ni(50 nm)/Au(300 nm). Reference numeral 24 designates an air-bridge wiring comprising Ti(50 nm)/Au(2 µm). Reference numeral 40 designates a contact hole. FIG. 2 is a cross-sectional view of the HBT array shown in FIG. 1 at the center of the structure in the array direction. In FIG. 2, the same reference numerals as in FIG. 1 designate the same parts. Reference numeral 26 designates a GaAs substrate. Reference numeral 27 designates a plated heat sink (hereinafter referred to as a PHS) comprising Au and having a thickness of 40 µm. Reference numeral 35 designates an insulating film, such as SiON. Reference numeral 24a designates a metal layer disposed on the inner surface of the via-hole 25 (hereinafter referred to as a via-hole metal). The via-hole metal 24a comprises the same metal as the air-bridge wiring 24, i.e., Ti(50 nm)/Au(2 µm), and is united with the air-bridge wiring 24. That is, the via-hole metal 24a and the air-bridge wiring 24 are included in a continuous metal layer.

The air-bridge wiring 24 connects the emitter electrode 21 of the HBT element to the via-holes 25 adjacent to the HBT element. The emitter area is about 2×20 µm². In this first embodiment of the invention, the via-holes 25 are present on both sides of the HBT array and between the adjacent HBT elements. Although only three HBT elements are illustrated in FIGS. 1 and 2, an ordinary HBT array includes about ten HBT elements.

Figure 3:
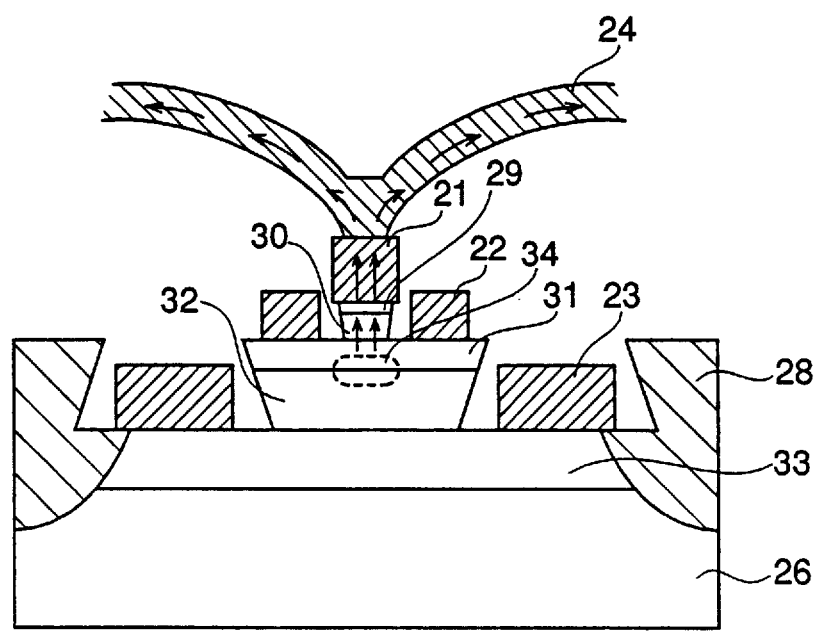
FIG. 3 is a cross-sectional view illustrating an HBT element included in the HBT according to the first embodiment of the present invention.

FIG. 3 is a cross-sectional view of an HBT element included in the HBT array. In FIG. 3, the insulating film 35 is omitted. An n⁺ type GaAs collector contact layer 33 having a dopant concentration of $5 \times 10^{18}/cm^3$ and a thickness of 500 nm is disposed on the GaAs substrate 26. An n type GaAs collector layer 32 having a dopant concentration of $5 \times 10^{16}/cm^3$ and a thickness of 500 nm is disposed on a center part of the collector contact layer 33. A p⁺ type GaAs base layer 31 having a dopant concentration of $4 \times 10^{19}/cm^3$ and a thickness of 100 nm is disposed on the collector layer 32. An n type $Al_{0.3}Ga_{0.7}As$ emitter layer 30 having a dopant concentration of $5 \times 10^{17}/cm^3$ and a thickness of 150 nm is disposed on a center part of the base layer 31. An n⁺ type GaAs emitter contact layer 29 having a dopant concentration of $5 \times 10^{18}/cm^3$ and a thickness of 150 nm is disposed on the emitter layer 30. The emitter electrode 21 is disposed on the emitter contact layer 29. The base electrode 22 is disposed on the base layer 31, surrounding the emitter electrode 21. The spaced apart collector electrodes 23 are disposed on the collector contact layer 33 at opposite sides of the collector layer 32. Reference numeral 28 designates insulating regions, and numeral 34 designates a heat generating part of the HBT element.

FIGS. 4(a) to 4(e) are cross-sectional views illustrating process steps in a method of fabricating the HBT according to the first embodiment of the invention. In the figures, the same reference numerals as in FIG. 2 designate the same or corresponding parts. Reference numeral 35 designates an insulating film, numeral 36 designates a resist pattern, numeral 37 designates a feeding layer for electroplating, and numeral 38 designates a plated metal part of the air-bridge wiring 24 and the via-hole metal 24a.

Initially, as illustrated in FIG. 4(a), after fabrication of HBT elements on the GaAs substrate 26, an insulating film 35, such as SiON, is deposited over each HBT element, and a portion of the insulating film 35 on the top of the emitter electrode 21 is selectively removed by reactive ion etching (hereinafter referred to as RIE), thereby forming a contact hole 40.

Thereafter, as illustrated in FIG. 4(b), about 30 µm deep holes 25a are formed in regions of the GaAs substrate 26 at both sides of each HBT element by RIE.

In the step of FIG. 4(c), a resist pattern 36 is formed on the insulating film 35. This resist pattern 36 provides a space beneath the air-bridge wiring 24 which is later produced on the resist pattern 36. Then, Ti(50 nm)/Au(200 nm) is deposited over the entire surface of the substrate including the inner surface of the holes 25a by sputtering to produce a feeding layer 37 for electroplating. After masking with resist the parts of the feeding layer 37 where the air-bridge wiring 24 and the via-hole metal 24a are not required, Au is plated on uncovered part of the feeding layer 37 to a thickness of 1800 nm to produce a plated Au layer 38, followed by removal of the resist pattern 36. As a result, a plated metal wiring serving both as the air-bridge wiring 24 and the via-hole metal 24a is completed (FIG. 4(d)).

In the step of FIG. 4(e), the rear surface of the GaAs substrate is ground and polished until the feeding layer 37 at the bottom of the hole 25a is exposed and, thereafter, a PHS 27 comprising 40 µm thick Au is formed on the rear surface of the substrate by electroplating. In figures other than FIGS. 4(a)–4(e), the feeding layer 37 and the plated Au layer 38 are illustrated as a single metal layer for simplification.

Figure 14:
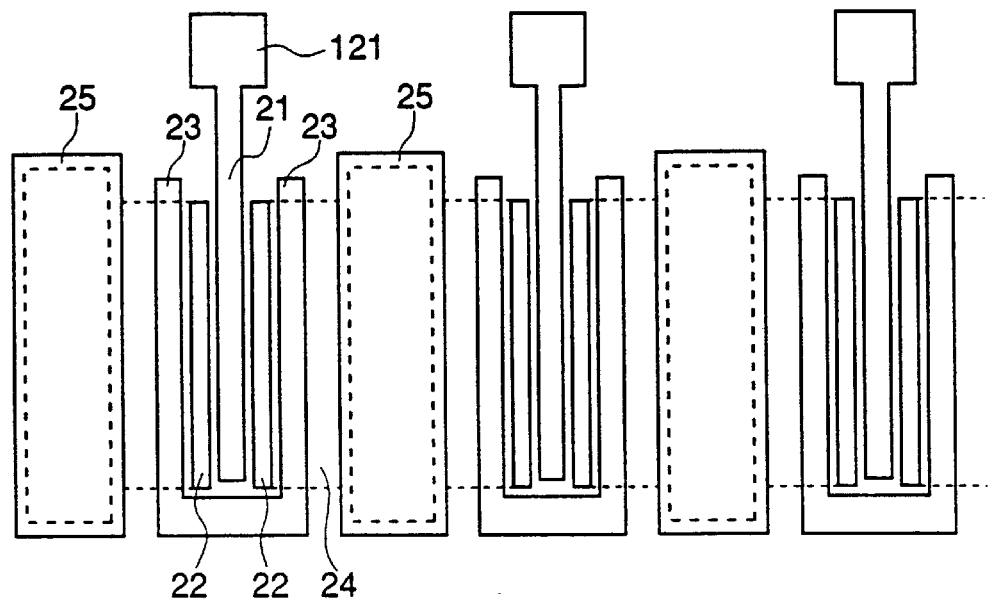
FIGS. 14(a) and 14(b) are a plan view and a cross-sectional view, respectively, illustrating an HBT in accordance with an eighth embodiment of the present invention.
Figure 14:
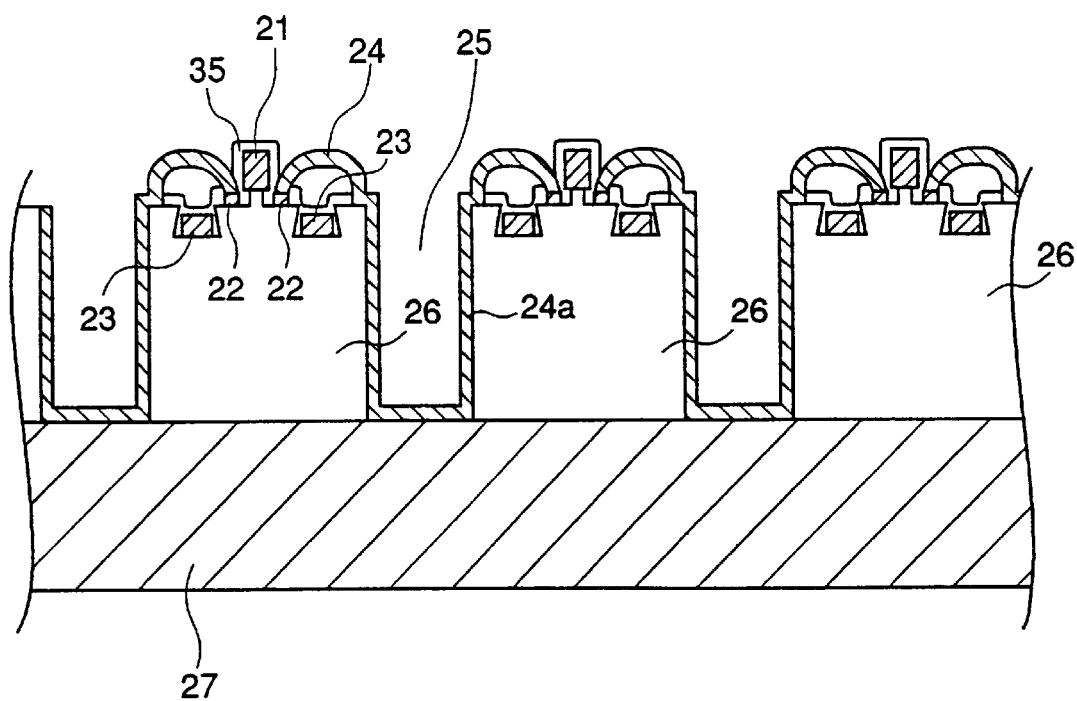

In the HBT element shown in FIG. 3, heat is produced in the base-emitter junction region 34. This heat is dissipated through the GaAs substrate 26 when the air-bridge wiring is absent. Since the heat conductivity of GaAs is lower than the heat conductivity of metal, the thermal resistance of this heat dissipation path (first heat dissipation path) is unfavorably increased. However, in this first embodiment of the invention, in addition to the first heat dissipation path, the HBT element is provided with a second heat dissipation path through the emitter electrode 21, the air-bridge wiring 24, and the via-hole 25 as indicated by arrows in FIG. 3. Since the constituents of the second path are made of metal, the thermal resistance is further reduced as compared to the prior art structure shown in FIG. 14 wherein heat is dissipated through the GaAs substrate at the both sides of the HBT array. More specifically, while in the prior art structure shown in FIG. 14 the GaAs substrate is present beneath the heat spreading region of the air-bridge wiring, in the structure according to this first embodiment the via-hole metal 24a is present in that region, whereby the thermal resistance is reduced. Further, since the via-hole 25 is present in close vicinity to the HBT element, the length of the air-bridge wiring 24 connecting the HBT element to the via-hole is shortened as compared to the prior art structure and, therefore, the thermal resistance of the air-bridge wiring is reduced by the reduction in the air-bridge length. Likewise, the inductance of the air-bridge wiring is reduced, that is, the emitter inductance is reduced.

In the fabricating method of the HBT according to the first embodiment of the invention, since the air-bridge wiring 24 and the via-hole metal 24a are formed simultaneously in the same process, the fabrication is significantly simplified. Further, since the air-bridge wiring 24 and the via-hole metal 24a are formed as a continuous metal layer, a structure for connecting them is not necessary. Therefore, it is not necessary to secure a space for the structure between the HBT element and the via-hole. Therefore, the via-hole 25 can be formed close to the HBT element, so that the heat conducting path from the emitter electrode to the via-hole, i.e., the air-bridge wiring 24, is shortened. As a result, the heat dissipation property is improved, and the emitter inductance is reduced. Further, the absence of the structure for connecting the air-bridge wiring and the via-hole metal improves the reliability of the device. Furthermore, since the air-bridge wiring 24 is short, it is possible to reduce the thickness of the air-bridge wiring in respect of the thermal resistance and the mechanical strength, whereby the above-described electroplating process is facilitated.

As described above, according to the first embodiment of the present invention, since the thermal resistance of the heat transfer path of the HBT element is reduced and the heat dissipation property is improved, an unwanted increase in the temperature of the HBT element during the operation is suppressed. Therefore, degradation in electrical characteristics of the HBT element is avoided, and reliability is improved. Further, since the emitter inductance is reduced, the high-frequency characteristics of the HBT element are improved. Furthermore, since the adjacent HBT elements are separated from each other by a via-hole, the thermal interference between the HBT elements is significantly reduced. Accordingly, an unwanted increase in the temperature of the device due to heat confined in the HBT elements in the middle of the HBT array is suppressed. Further, since each HBT element is connected to the adjacent via-hole through the air-bridge wiring, the uniformity in the thermal resistances of the HBT elements is improved.

[Embodiment 2]

Figure 5:
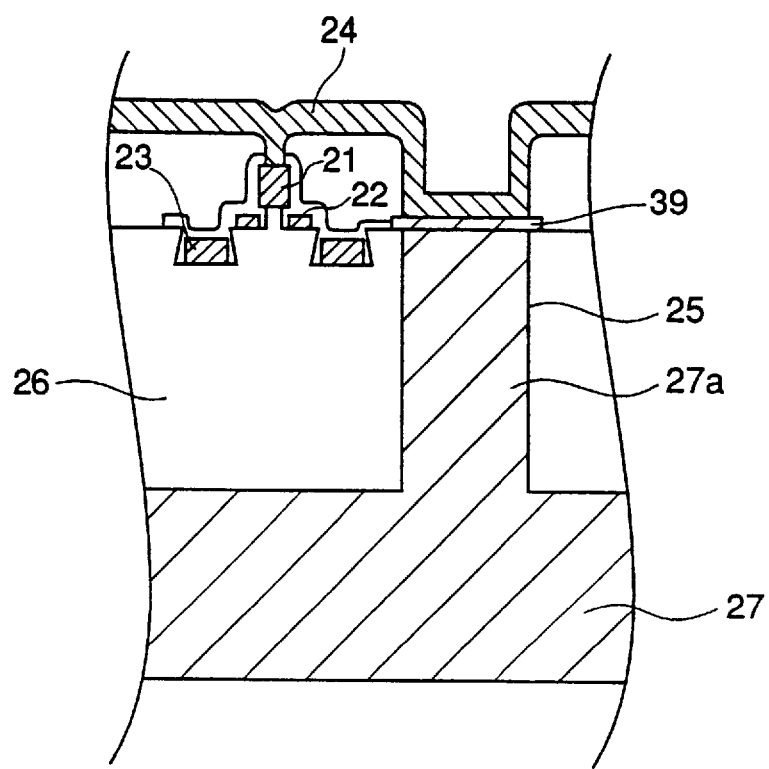
FIG. 5 is a cross-sectional view illustrating an HBT in accordance with a second embodiment of the present invention.

FIG. 5 is a cross-sectional view illustrating an HBT in accordance with a second embodiment of the present invention. In the figure, the same reference numerals as in FIG. 2 designate the same or corresponding parts. Reference numeral 39 designates an electrode disposed on the front surface of the substrate 26 contacting the via-hole 25 (hereinafter referred to as a via-hole upper electrode). The via-hole upper electrode 39 comprises Ti(50 nm)/Au(2 $\mu$m). The via-hole 25 is filled with the metal of the PHS 27, i.e., the via-hole metal 27a is united with the PHS 27. The air-bridge wiring 24 is connected through the via-hole upper electrode 39 to the via-hole metal 27a.

Figure 6:
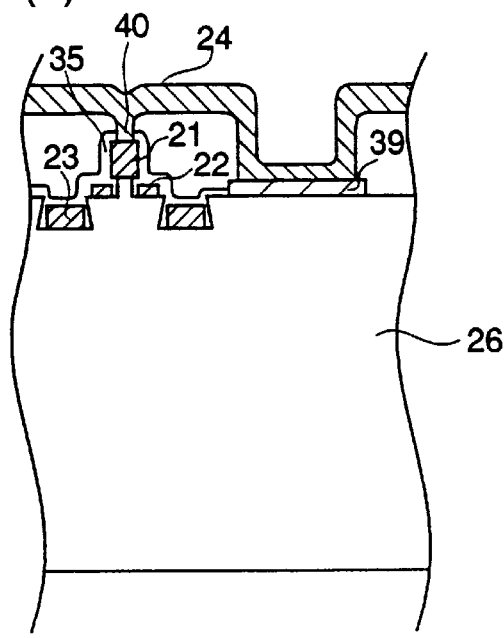
FIGS. 6(a)–6(c) are cross-sectional views illustrating process steps in a method of fabricating the HBT shown in FIG. 5.
Figure 6:
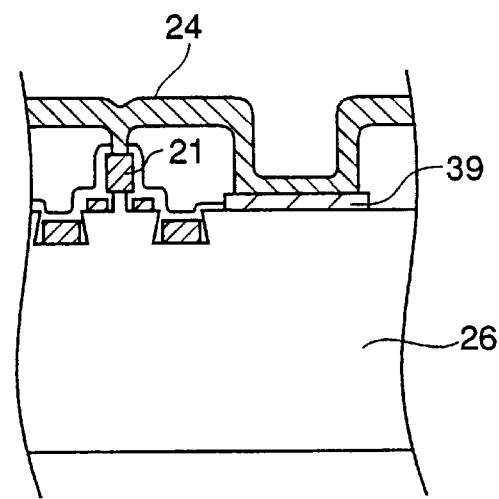
Figure 6:
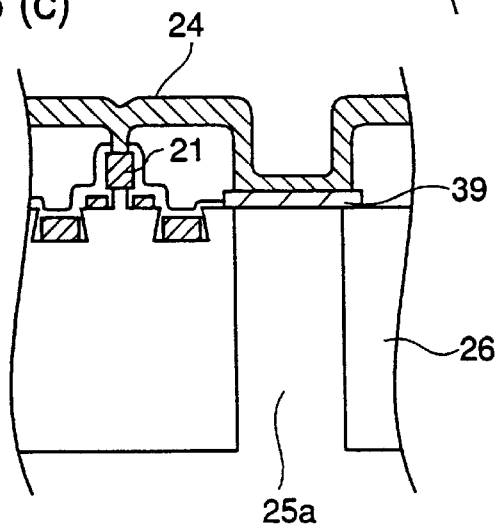

FIGS. 6(a)–6(c) are cross-sectional views illustrating process steps in a method of fabricating the HBT shown in FIG. 5. Initially, as illustrated in FIG. 6(a), after fabrication of HBT elements and patterning of the insulating film 35 to form the contact hole 40, the via-hole upper electrode 39 is formed on the surface of the substrate 26 in close vicinity to each HBT element, followed by formation of the air-bridge wiring 24. The air-bridge wiring 24 is formed in the same process as described in the first embodiment of the invention. Next, as illustrated in FIG. 6(b), the GaAs substrate 26 is ground and polished at the rear surface until the thickness of the substrate is reduced to about 30 $\mu$m.

In the step of FIG. 6(c), a portion of the GaAs substrate 26 opposite the via-hole upper electrode 39 is selectively etched by RIE from the rear surface of the substrate until the via-hole upper electrode 39 is exposed, thereby forming a hole 25a for the via-hole 25. Thereafter, 40 $\mu$m thick Au is plated over the rear surface of the substrate 26 to form a PHS 27. During the electroplating, the hole 25a is filled with Au, resulting in the structure shown in FIG. 5.

In the HBT illustrated in FIG. 5, heat generated in the HBT element is transferred through the emitter electrode 21, the air-bridge wiring 24, the via-hole upper electrode 39, and the via-hole metal 27a to the PHS 27. The via-hole metal 27a is not a thin metal film plated on the inner surface of the hole 25 as described in the first embodiment but a metal completely filling in the hole 25a. Therefore, the thermal resistance of the via-hole 25 is lowered as compared to the first embodiment of the invention. Further, since the via-hole 25 is located close to the HBT element, the air-bridge wiring is shortened, and the thermal resistance of the air-bridge wiring is reduced by the reduction in the air-bridge length. Likewise, the inductance of the air-bridge wiring is reduced, that is, the emitter inductance is reduced. Further, since the via-hole upper electrode 39 is present between the air-bridge wiring 24 and the via-hole 25, the adhesion between them is improved.

In the method of fabricating an HBT according to the second embodiment of the present invention, since the connection between the via-hole upper electrode 39 and the air-bridge wiring 24 is made on the via-hole region, it is not necessary to secure a region for the connection only. Therefore, the via-hole 25 can be located close to the HBT element, so that the heat conducting path from the emitter electrode 21 to the via-hole 25, i.e., the air-bridge wiring 24, can be shortened. As already described above, a short air-bridge wiring provides reduced thermal resistance and reduced emitter inductance and permits a reduction in the thickness of the air-bridge wiring. The reduction in the thickness of the air-bridge wiring facilitates the electroplating of the air-bridge wiring. Further, since the via-hole metal 27a and the PHS 27 are simultaneously produced, the fabricating process is simplified. Furthermore, since the via-hole metal 27a is united with the PHS 27, there is no necessity for connecting them, whereby reliability is improved.

As described above, according to the second embodiment of the present invention, since the thermal resistance of the heat transfer path for each HBT element is reduced and the heat dissipation property is improved, an unwanted increase in the temperature of the element during operation is suppressed, whereby degradation of electrical characteristics of the HBT element is avoided and reliability is improved. Further, because the emitter inductance is reduced, the high-frequency characteristics of the HBT element are improved. Furthermore, since adjacent HBT elements are separated from each other by the via-hole, the thermal interference between the HBT elements is significantly reduced. Accordingly, an unwanted increase in the temperature of HBT elements in the middle of the HBT array due to heat confined in these HBT elements is suppressed. Further, since each HBT element is connected to the adjacent via-hole through the air-bridge wiring, the uniformity of thermal resistances of the HBT elements is improved.

[Embodiment 3]

Figure 7:
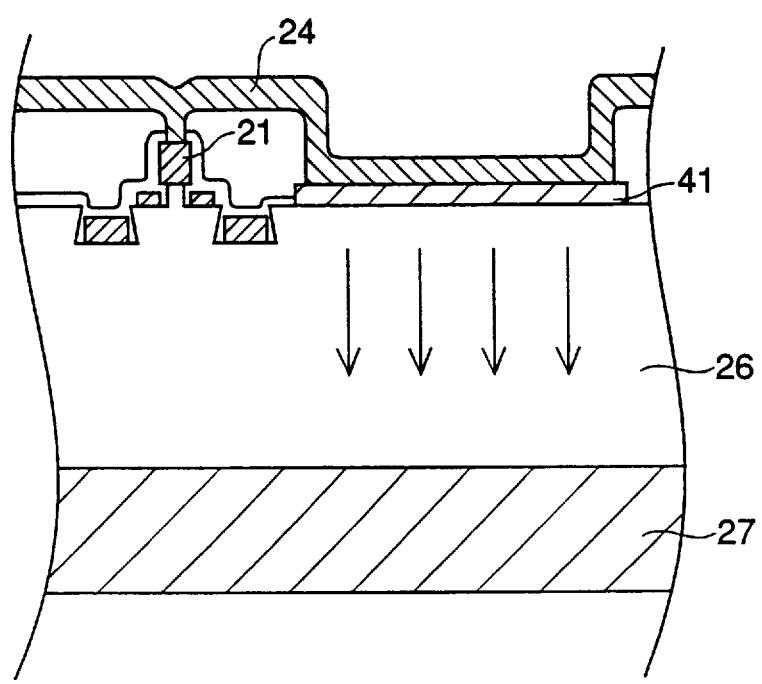
FIG. 7 is a cross-sectional view illustrating an HBT in accordance with a third embodiment of the present invention.

FIG. 7 is a cross-sectional view illustrating an HBT in accordance with a third embodiment of the present invention. In FIG. 7, the same reference numerals as in FIG. 2 designate the same or corresponding parts. Reference numeral 41 designates a heat dissipating metal film comprising Ti(50 nm)/Au(2 μm) and having a width of 10 μm–100 μm. The air-bridge wiring 24 connects the emitter electrode 21 of the HBT element to the heat dissipating metal film 41. In this structure, heat generated in the HBT element is transferred through the emitter electrode 21, the air-bridge wiring 24, the heat dissipating metal film 41, and the GaAs substrate 26 to the PHS 27 as illustrated by arrows in FIG. 7.

Figure 8:
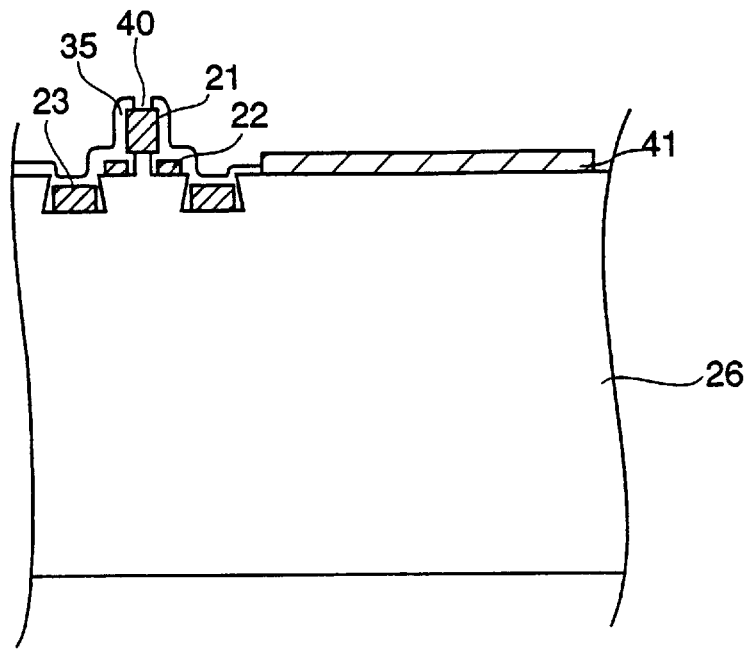
FIGS. 8(a) and 8(b) are cross-sectional views illustrating process steps in a method of fabricating the HBT shown in FIG. 7.
Figure 8:
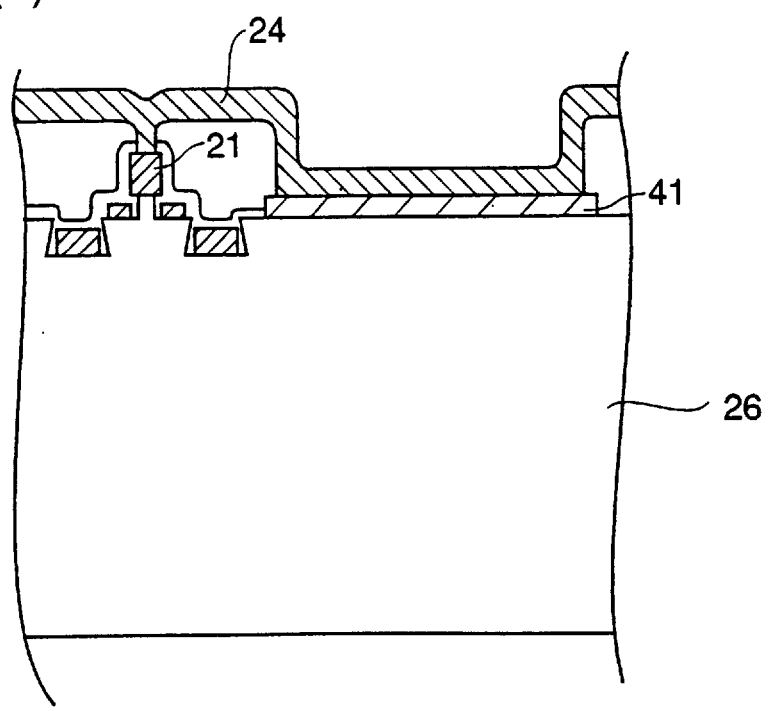

FIGS. 8(a) and 8(b) are cross-sectional views illustrating process steps in a method of fabricating the HBT shown in FIG. 7. Initially, as illustrated in FIG. 8(a), after fabrication of HBT elements and patterning of the insulating film 35 to form the contact hole 40, the heat dissipating metal film 41 is formed on the surface of the GaAs substrate 26 close to each HBT element.

Thereafter, as illustrated in FIG. 8(b), the air-bridge wiring 24 is produced in the same process as described in the first embodiment of the invention. Although the heat dissipating metal film and the air-bridge wiring are produced in different process steps, these may be produced in the same process step. After fabrication of the air-bridge wiring 24, the GaAs substrate 26 is ground and polished at the rear surface until the thickness of the substrate is reduced to about 30 μm. Thereafter, 40 μm thick Au is plated over the rear surface of the substrate to produce a PHS 27, thereby completing the structure shown in FIG. 7.

In the HBT shown in FIG. 7, in place of the via-holes 25 employed in the first and second embodiments of the invention, the heat dissipating metal films 41 each having a width of 10–100 μm are directly disposed on the GaAs substrate 26 at both sides of the HBT array and between the HBT elements. Since the heat dissipating metal film 41 has a large area, the heat dissipation property of the HBT element is improved as in the case where the via-hole 25 is employed. Since the heat dissipating metal film 41 is close to the HBT element, the length of the air-bridge wiring 24 connecting the emitter electrode 21 to this metal film 41 is shortened, whereby the thermal resistance of the air-bridge wiring 24 is reduced. The reduction in the air-bridge length contributes not only to the improvement of the heat dissipation property of the element but also to a reduction in the inductance of the air-bridge wiring. Further, the adhesion between the air-bridge wiring 24 and the GaAs substrate 26 is improved by the heat dissipating metal film 41 interposed between them.

In the method of fabricating the HBT according to the second embodiment of the invention, since the connection between the heat dissipating metal film 41 and the air-bridge wiring 24 is made on the heat dissipating metal film 41, it is not necessary to reserve a region only for the connection. Therefore, the heat dissipating metal film 41 is located close to the HBT element, and the length of the air-bridge wiring 24 connecting the HBT element to the heat dissipating metal film 41 is shortened. Thereby, as already described above, the thermal resistance is reduced and the emitter inductance is reduced. Further, since the thickness of the air-bridge wiring 24 can be reduced, the electroplating for the air-bridge wiring 24 is facilitated.

As described above, according to the third embodiment of the present invention, since the length of the air-bridge wiring connecting the emitter electrode 21 of the HBT element to the heat dissipating metal film 41 is short, the thermal resistance is reduced, whereby the heat dissipation property is improved. Therefore, unwanted increase in the temperature of the HBT element during the operation is suppressed, whereby degradation of electrical characteristics of the HBT element is avoided and the reliability is improved. Further, since the inductance of the air-bridge wiring is reduced, the emitter inductance is reduced, whereby the high-frequency characteristics of the HBT element are improved. Furthermore, since each HBT element is connected to an adjacent heat dissipating metal film through the air-bridge wiring, the uniformity of thermal resistances of the HBT elements is improved.

[Embodiment 4]

Figure 9:
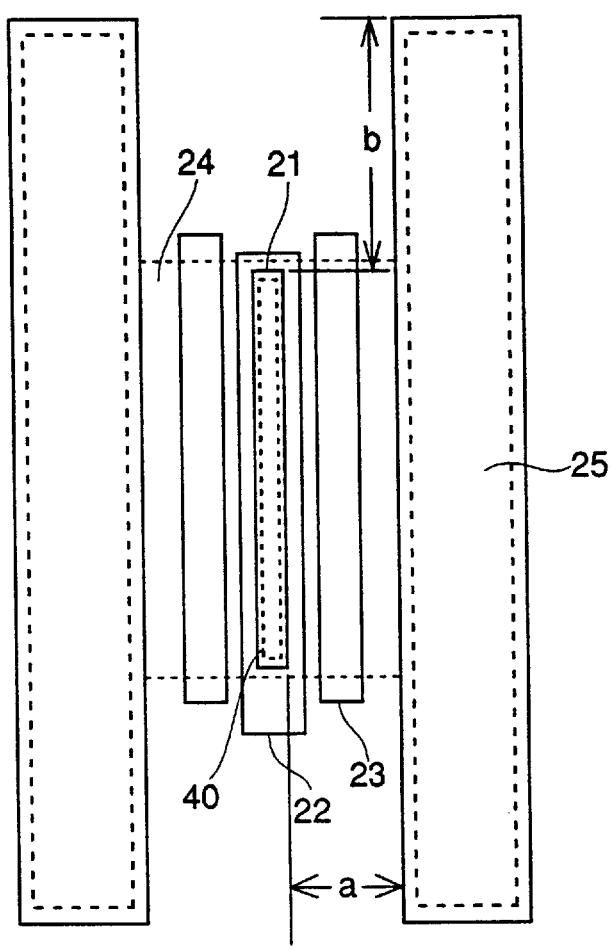
FIG. 9 is a plan view illustrating an HBT in accordance with a fourth embodiment of the present invention.

FIG. 9 is a plan view illustrating an HBT in accordance with a fourth embodiment of the present invention. In FIG. 9, the same reference numerals as in FIG. 1 designate the same or corresponding parts. Although only one HBT element is illustrated in FIG. 9, actually a plurality of HBT elements are arranged in an array as shown in FIG. 1. In the figure, reference character a denotes an interval between the emitter electrode 21 and the via-hole 25 in the array direction of the HBT elements, and reference character b denotes an interval between an end of the emitter electrode 21 and an end of the via-hole 25 in a direction perpendicular to the array direction. Here, a is smaller than b (a<b).

In an HBT array structure having a via-hole between adjacent HBT elements, thermal interference between the HBT elements can be suppressed by increasing the width of the via-hole in the direction perpendicular to the array direction. In the structure shown in FIG. 9, when diffusion of heat from the above-described heat generating region (the base-collector junction) under the rectangular emitter region toward the surface of the substrate is considered, the heat generated in the HBT element and transferred through the substrate is effectively absorbed by the via-hole 25 when the width of the via-hole satisfies the relationship of a<b. Usually, the interval a is about 20 μm. Thereby, the thermal separation between the HBT elements is improved. As a result, an unwanted increase in the temperature of HBT elements in the middle of the HBT array due to heat confined in these HBT elements is suppressed.

[Embodiment 5]

Figure 10:
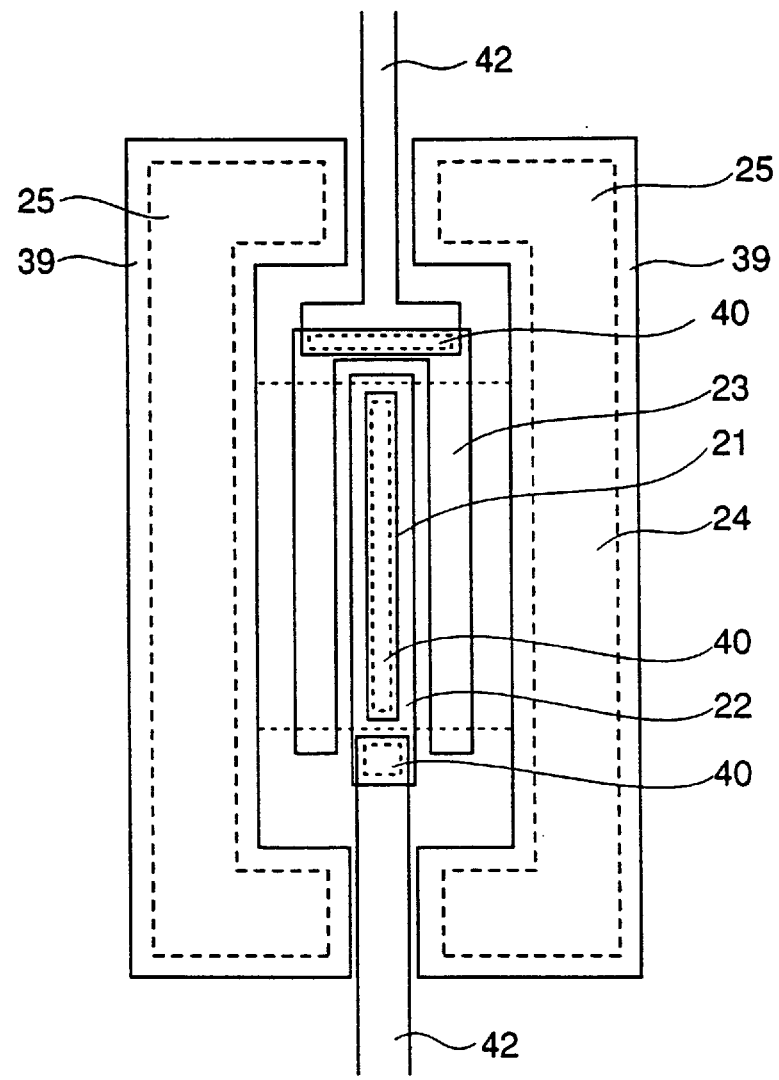
FIG. 10 is a plan view illustrating an HBT in accordance with a fifth embodiment of the present invention.

FIG. 10 is a plan view illustrating an HBT in accordance with a fifth embodiment of the present invention. In FIG. 10, the same reference numerals as in FIG. 1 designate the same or corresponding parts. Reference numeral 42 designates a metal film wiring comprising Ti(50 nm)/Au(2 μm). Although only one HBT element is illustrated in FIG. 10, actually a plurality of HBT elements are arranged in an array as shown in FIG. 1. In this fifth embodiment of the invention, a via-hole 25 surrounds the HBT element leaving a minimum portion of the GaAs substrate required for supporting the element region. The via-hole 25 is filled with the metal of the PHS. A cross section taken along a line A-A' in FIG. 10 is similar to FIG. 5 except that the via-hole is present at the both sides of the HBT elements. Alternatively, the via-hole structure according to the first embodiment in which the metal film 24a is disposed on the inner surface of the via-hole may be applied to this fifth embodiment of the invention.

As described above, according to the fifth embodiment of the present invention, since the via-hole 25 is arranged surrounding the HBT element, heat generated in the HBT element and diffused toward the substrate is almost completely absorbed by the via-hole, so that the thermal interference between adjacent HBT elements is suppressed with higher efficiency than in the structure shown in FIG. 4. As a result, an unwanted increase in the temperature of HBT elements in the middle of the HBT array due to heat confined in these HBT elements is suppressed.

[Embodiment 6]

Figure 11:
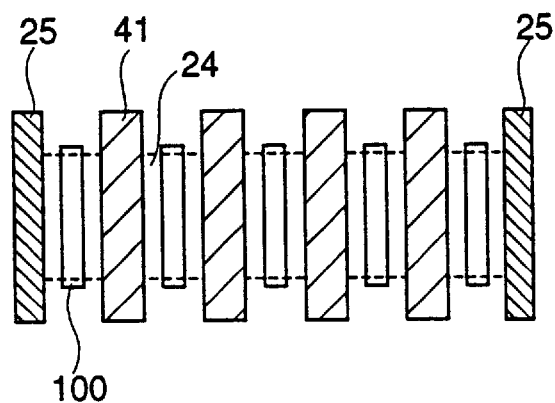
FIGS. 11(a) and 11(b) are plan views illustrating an HBT in accordance with a sixth embodiment of the present invention.
Figure 11:
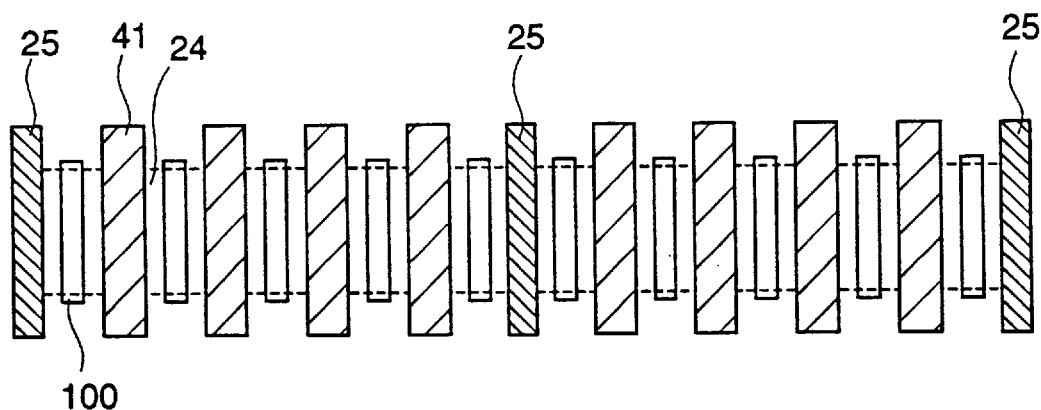

FIGS. 11(a) and 11(b) are plan views illustrating HBTs in accordance with a sixth embodiment of the present invention. In these figures, reference numeral 100 designates an HBT element. Electrodes of the HBT element 100 are not shown. In FIG. 11(a), via-holes 25 are disposed at both ends of an HBT array including five HBT elements, and heat dissipating metal films 41 are disposed between the HBT elements 100. The via-holes 25, the heat dissipating metal films 41, and the emitter electrodes (not shown) of the HBT elements are connected by the air-bridge wiring 24. In FIG. 11(b), via-holes 25 are disposed at both ends of and in the center of an HBT array including ten HBT elements, and heat dissipating metal films 41 are disposed between the HBT elements except the center region where the via-hole 25 is present. The via-holes 25, the heat dissipating metal films 41, and the emitter electrodes (not shown) of the HBT elements are connected by the air-bridge wiring 24.

In the HBTS according to this sixth embodiment of the invention, heat generated in the HBT elements is dissipated through the via-holes 25 at the both ends of and in the center of the HBT array and through the heat dissipating metal films 41 between the HBT elements. Since the via-holes 25 and the heat dissipating metal films 41 are close to the HBT elements, the length of the air-bridge wiring 24 connecting the emitter electrode of each HBT element to the via-hole or the metal film is shortened, so that the heat dissipation property is significantly improved as compared to the prior art structure shown in FIG. 14 in which heat dissipation regions are present only on the both sides of the HBT array. Therefore, an undesired increase in the element temperature during the operation is suppressed, whereby degradation of electrical characteristics of the HBT element is avoided and reliability is improved. Further, since the emitter inductance is reduced, the high-frequency characteristics of the HBT element are improved. Furthermore, the thermal resistances of the HBT elements are made uniform.

[Embodiment 7]

Figure 12:
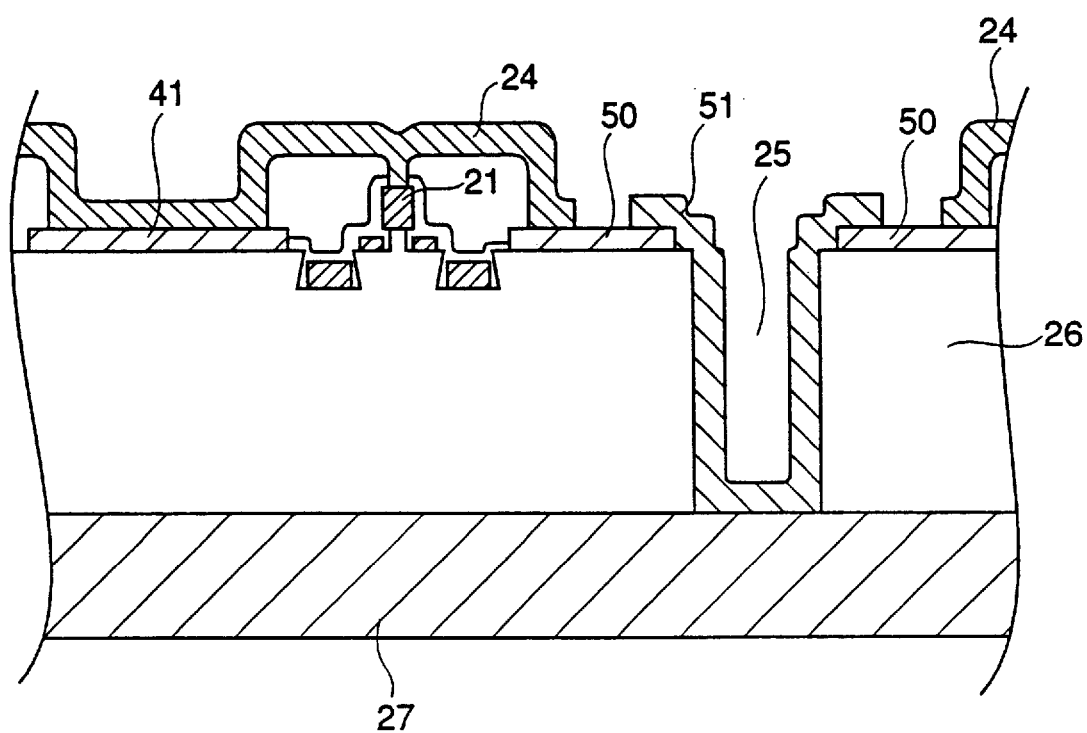
FIG. 12 is a cross-sectional view illustrating an HBT in accordance with a seventh embodiment of the present invention.

FIG. 12 is a cross-sectional view illustrating an HBT in accordance with a seventh embodiment of the present invention. In FIG. 12, the same reference numerals as in FIG. 2 designate the same or corresponding parts. Reference numeral 50 designates a wiring comprising Ti(50 nm)/Au(2 μm). Reference numeral 51 designates a via-hole metal comprising Ti(50 nm)/Au(2 μm). The air-bridge wiring 24 is connected through the wiring 50 to the via-hole metal 51. The via-hole metal 51 is connected to the PHS 27 at the rear surface of the substrate 26. A heat dissipating metal film 41 is disposed on the opposite side of the HBT element from the via-hole 25. The air-bridge wiring 24 is connected to the heat dissipating metal film 41. In place of the heat dissipating metal film 41, a via-hole of the same structure as the via-hole 25 may be used.

FIGS. 13(a)–13(e) are cross-sectional views illustrating process steps in a method of fabricating the HBT shown in FIG. 12. Initially, as illustrated in FIG. 13(a), after fabrication of the HBT element on the GaAs substrate 26, an insulating film 35 is deposited over the HBT element and patterned to form the contact hole 40.

Thereafter, as illustrated in FIG. 13(b), the wiring 50 and the heat dissipating metal film 41 are simultaneously formed in the same process step using the same material, for example, Ti/Au. However, the wiring 50 and the metal film 41 may be formed in different process steps so that materials and structures thereof are optimized for their objects.

In the step of FIG. 13(c), the air-bridge wiring 24 is formed in the same process as in the first embodiment of the invention. Thereafter, as illustrated in FIG. 13(d), a prescribed portion of the substrate in the vicinity of the wiring 50 is selectively etched by RIE to form a hole 25a for the via-hole 25. The depth of the hole 20a is about 30 μm.

Further, as illustrated in FIG. 13(e), the via-hole metal 51 comprising Ti(50 nm)/Au(2 μm) is formed by electroplating. Finally, the GaAs substrate 26 is ground and polished at the rear surface until the via-hole metal 51 is exposed, followed by electroplating of 40μ thick Au over the rear surface of the substrate to produce the PHS 27, thereby completing the structure shown in FIG. 12.

In the HBT shown in FIG. 12, heat generated in the HBT element is transferred through the emitter electrode 21, the air-bridge wiring 24, the wiring 50, and the via-hole metal 51 to the PHS 27. Since these parts are made of metal, the thermal resistance is significantly reduced as compared to the prior art structure shown in FIG. 14 in which heat is transferred through the air-bridge wiring to the GaAs substrate. Further, since the wiring 50 is located close to the HBT element and the via-hole 25 is located close to the wiring 50, the heat transfer path through the air-bridge wiring 24 and the wiring 50 is shortened compared to the prior art structure, whereby the thermal resistance is further reduced. As a result, the heat dissipation property is improved.

In the method of fabricating an HBT according to this seventh embodiment of the invention, since the via-hole metal 51 and the air-bridge wiring 24 are produced in different process steps, it is possible to optimize materials and shapes thereof so that the best heat dissipation property, electrical characteristics, and reliability are realized. In addition, process steps for producing the via-hole metal 51 and the air-bridge wiring 24 with high stability, respectively, can be employed, so that the reliability of the device and the production yield are improved. Furthermore, since the wiring 50 is located close to the HBT element, the length of the air-bridge wiring 24 connecting the emitter electrode 21 of the HBT element to the wiring 50 is shortened. Therefore, as already described above, the thickness of the air-bridge wiring 24 can be reduced, and the electroplating of the air-bridge wiring is facilitated.

According to the seventh embodiment of the present invention, since the heat dissipation property is improved, an unwanted increase in the temperature of the HBT element during operation is suppressed, whereby degradation of electrical characteristics of the HBT element is avoided and reliability is improved. Further, since the HBT elements are separated from each other by the via-holes 25, the thermal interference between the HBT elements is significantly reduced. Therefore, an unwanted increase in the temperature of HBT elements in the middle of the array due to heat confined in these elements is suppressed. In addition, since the HBT element is connected through the air-bridge wiring to the adjacent via-hole, the uniformity of the thermal resistances of the HBT elements is improved.

[Embodiment 8]

Figure 27:
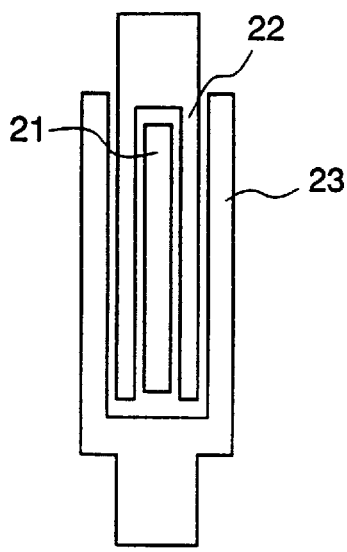
FIGS. 27(a)–27(b) are a plan view and a cross-sectional view, respectively, illustrating a base-grounded HBT according to the prior art.
Figure 27:
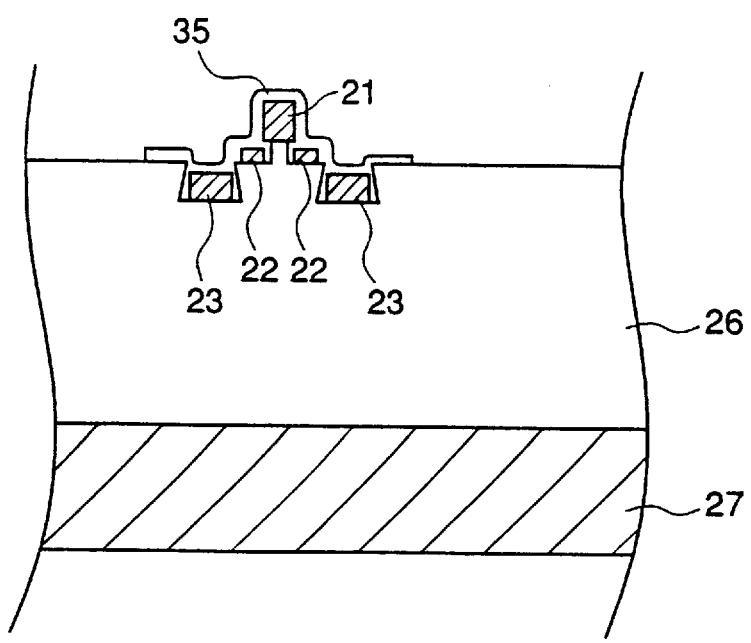

Generally, a base-grounded bipolar transistor provides a higher power gain than an emitter-grounded bipolar transistor and, therefore, it is suitable for high-frequency operation. However, the base-grounded bipolar transistor is inferior to the emitter-base bipolar transistor in power efficiency. The poor power efficiency of the base-grounded bipolar transistor causes unwanted heat generation and temperature rise in the device, resulting in thermal runaway that is an obstacle to increasing the output power and reliability of the device. However, in prior art base-grounded bipolar transistors, measures to reduce the thermal resiatence other than thinning the substrate are not taken. An example of the prior art base-grounded bipolar transistor is shown in FIGS. 27(a) and 27(b).

The eighth to eleventh embodiments of the invention are directed to solving the problems of the prior art base-grounded bipolar transistor and it is an object of those embodiments to increase reliability by suppressing unwanted temperature rise in the device when it is biased and operated.

FIGS. 14(a) and 14(b) are a plan view and a cross-sectional view, respectively, illustrating a base-grounded HBT according to an eighth embodiment of the present invention. In the figures, the same reference numerals as in FIGS. 1 and 2 designate the same or corresponding parts. Reference numeral 121 designates an emitter input terminal. In this base-grounded HBT, materials and thicknesses of metal layers constituting the electrodes, the PHS, and the air-bridge, and semiconductor layers constituting the emitter layer, the base layer, and the collector layer are the same as those described in the first embodiment.

The structure of the HBT according to this eighth embodiment is fundamentally identical to the structure according to the first embodiment except that the air-bridge wiring 24 is connected to the base electrode 22 of each HBT element whereas it is connected to the emitter electrode 21 in the first embodiment. More specifically, the base electrode 22 of each HBT element is connected through the air-bridge wiring 24 to the via-hole adjacent to the element, and the air-bridge wiring 24 and the via-hole metal 24a are included in a continuous metal layer.

The fabricating process of the base-grounded HBT according to this eighth embodiment is fundamentally identical to the fabricating process according to the first embodiment except that the air-bridge wiring 24 comprising the feeding layer 37 and the plated metal layer 38 are connected to the base electrode 22 whereas it is connected to the emitter electrode 21 in the first embodiment.

In the base-grounded HBT shown in FIGS. 14(a)–14(b), in addition to the first heat dissipation path from the HBT element through the substrate 26 to the PHS 27, there is a second heat dissipation path through the base electrode 22, the air-bridge wiring 24, and the via-hole 25 to the PHS 27. Therefore, the thermal resistance from the HBT element to the PHS is significantly reduced as in the first embodiment of the invention. Further, since the via-hole 25 is present close to the HBT element, the length of the air-bridge wiring 24 connecting the base electrode 22 to the via-hole 25 is shortened and, therefore, the thermal resistance of the air-bridge wiring is reduced by the reduction in the air-bridge length. Since the heat dissipation property is improved as described above, an unwanted increase in the temperature of the HBT element during operation is suppressed. Therefore, degradation in electrical characteristics of the HBT element is avoided, and reliability is improved. Further, since the length of the air-bridge wiring is shortened, the inductance of the air-bridge wiring is reduced. That is, the base inductance is reduced, whereby the high-frequency characteristics of the HBT element are improved. Furthermore, since the adjacent HBT elements are separated from each other by the via-hole 25, the thermal interference between the HBT elements is significantly reduced. Accordingly, an unwanted increase in the temperature of the device due to heat confined in the HBT elements in the middle of the HBT array is suppressed. Further, since each HBT element is connected to the adjacent via-hole 25 through the air-bridge wiring 24, the uniformity in the thermal resistances of the HBT elements is improved. The improved heat dissipation property and the uniform thermal resistance increase the output power and the power addition efficiency of the HBT.

[Embodiment 9]

Figure 15:
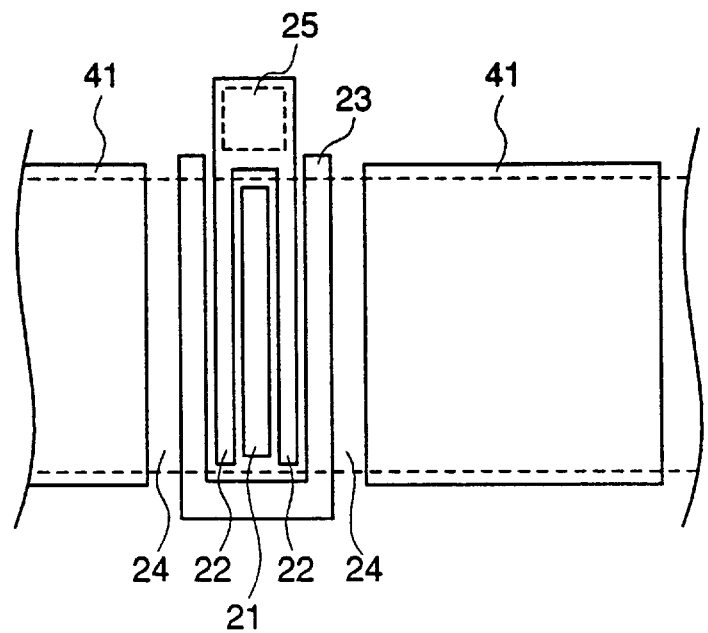
FIGS. 15(a)–15(b) are a plan view and a cross-sectional view, respectively, illustrating an HBT in accordance with a ninth embodiment of the present invention.
Figure 15:
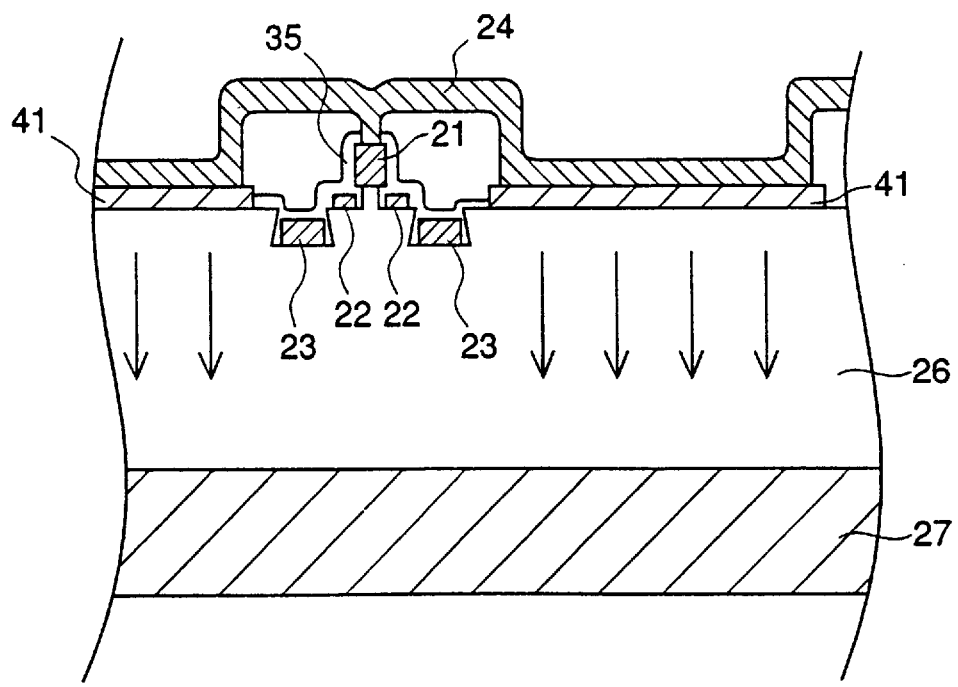

FIGS. 15(a) and 15(b) are a plan view and a cross-sectional view, respectively, illustrating a base-grounded HBT according to the ninth embodiment of the present invention. As shown in FIG. 15(a), the base electrode 22 is connected through the via-hole 25 to the PHS 27 and grounded. The cross-sectional view of this base-grounded HBT is identical to the cross-sectional view of the HBT shown in FIG. 7 according to the third embodiment of the invention. The emitter electrode 21 is connected through the air-bridge wiring 24 to the heat dissipating metal film 41.

In the HBT according to this ninth embodiment, the base electrode 22 is grounded, and bias voltage is applied to the collector electrode 23. Signals and bias current are input to the HBT from the emitter electrode 21, and signals amplified in the HBT are output from the collector electrode 23.

The fabricating process of this base-grounded HBT is identical to the fabricating process of the HBT shown in FIGS. 8(a)–8(b) according to the third embodiment of the invention.

In this ninth embodiment of the invention, since the emitter electrode 21 of each HBT element is connected through the air-bridge wiring 24 to the heat dissipating metal film 41 adjacent to the HBT element, heat produced in the HBT element is transferred through the emitter electrode 21, the air-bridge wiring 24, and the metal film 41 to the GaAs substrate 26, whereby the heat dissipation property of the HBT element is significantly improved. Therefore, an unwanted increase in the temperature of the HBT element during operation is suppressed, whereby degradation in electrical characteristics of the HBT element is avoided, resulting in an increase in reliability. Further, since each HBT element is connected through the air-bridge wiring 24 to the adjacent heat dissipating metal film 41, the uniformity of thermal resistances of the HBT elements is improved. The improved heat dissipation property and the uniform thermal resistance increase the output power and the power addition efficiency of the HBT. Furthermore, since the heat dissipating metal film 41 is disposed close to the HBT element, the length of the air-bridge wiring 24 connecting the element to the metal film 41 is shortened, whereby the inductance of the air-bridge wiring is reduced. As a result, the emitter inductance is reduced, and the high-frequency characteristics of the element are improved.

[Embodiment 10]

Figure 16:
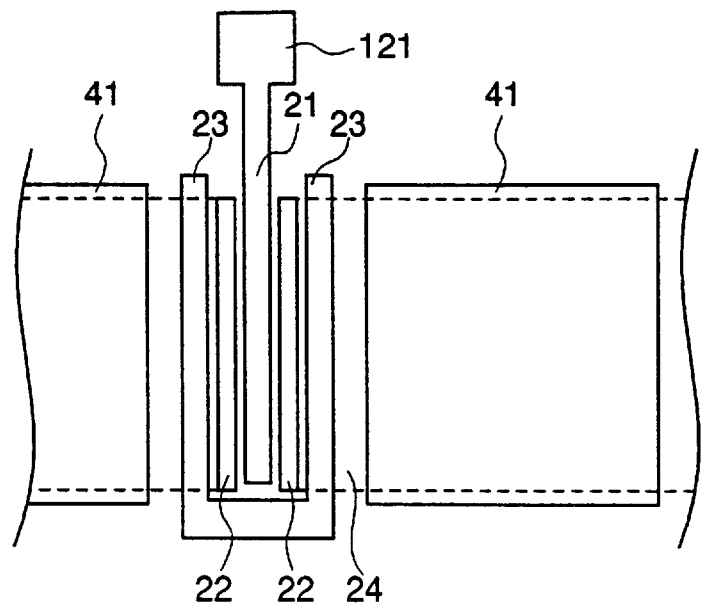
FIGS. 16(a)–16(b) are a plan view and a cross-sectional view, respectively, illustrating an HBT in accordance with a tenth embodiment of the present invention.
Figure 16:
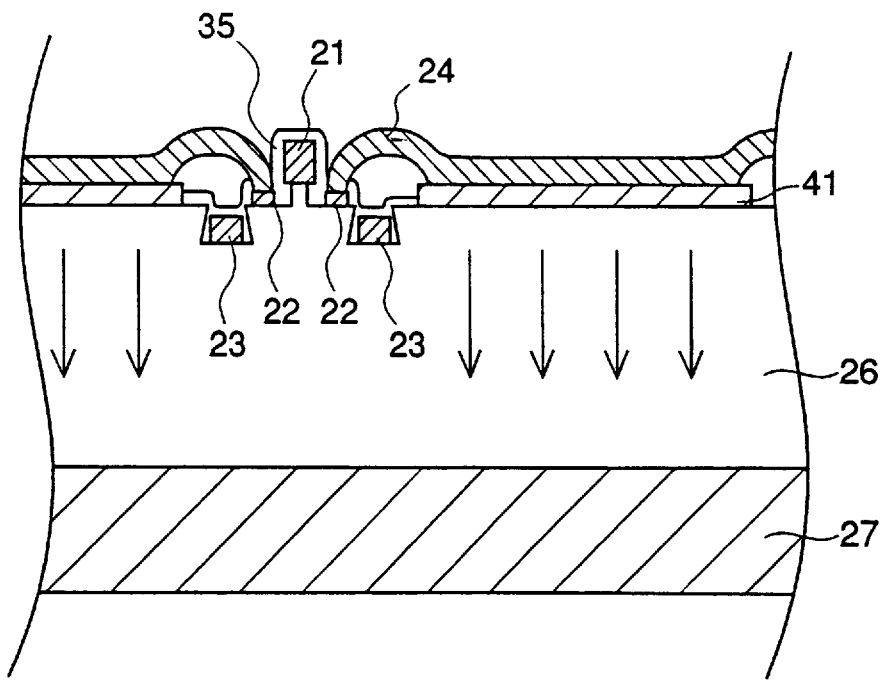

FIGS. 16(a) and 16(b) are a plan view and a cross-sectional view, respectively, illustrating a base-grounded HBT in accordance with a tenth embodiment of the present invention. The structure of this base-grounded HBT is identical to the HBT shown in FIG. 7 according to the third embodiment except that the base electrode 22 is connected through the air-bridge wiring 24 to the heat dissipating metal film 41 whereas the emitter electrode 21 is connected in the third embodiment.

In the HBT according to this tenth embodiment, the base electrode 22 is grounded, and bias voltage is applied to the collector electrode 23. Signals and bias current are input to the HBT from the emitter electrode 21, and signals amplified in the HBT are output from the collector electrode 23.

The fabricating process of the base-grounded HBT according to this tenth embodiment is fundamentally identical to the fabricating process of the HBT according to the third embodiment except that the base electrode 22 is connected through the air-bridge wiring 24 to the heat dissipating metal film 41 whereas the emitter electrode 21 is connected in the third embodiment.

In this tenth embodiment of the invention, since the base electrode 22 of each HBT element is connected through the air-bridge wiring 24 to the heat dissipating metal film 41 adjacent to the HBT element, heat produced in the HBT element is transferred through the base electrode 22, the air-bridge wiring 24, and the metal film 41 to the GaAs substrate 26, whereby the heat dissipation property of the HBT element is significantly improved. Therefore, an unwanted increase in the temperature of the HBT element during operation is suppressed, whereby degradation in electrical characteristics of the HBT element is avoided, resulting in an increase in reliability. Further, since each HBT element is connected through the air-bridge wiring 24 to the adjacent heat dissipating metal film 41, the uniformity of thermal resistances of the HBT elements is improved. The improved heat dissipation property and the uniform thermal resistance increase the output power and the power addition efficiency of the HBT. Furthermore, since the heat dissipating metal film 41 is disposed close to the HBT element, the length of the air-bridge wiring 24 connecting the base electrode 22 to the metal film 41 is shortened, whereby the inductance of the air-bridge wiring is reduced. As a result, the base inductance is reduced, and the high-frequency characteristics of the element are improved.

[Embodiment 11]

Figure 17:
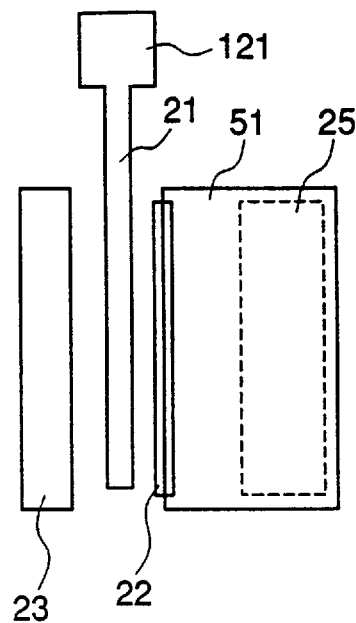
FIGS. 17(a)–17(b) are a plan view and a cross-sectional view, respectively, illustrating an HBT in accordance with an eleventh embodiment of the present invention.
Figure 17:
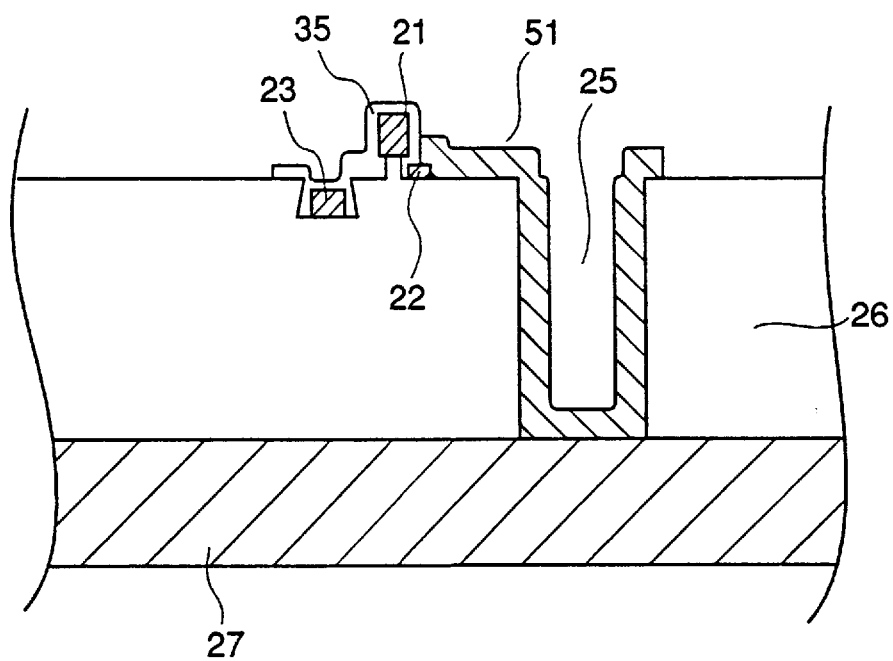

FIGS. 17(a) and 17(b) are a plan view and a cross-sectional view, respectively, illustrating an HBT according to an eleventh embodiment of the present invention. In this HBT, a collector electrode 23 is disposed on one side of an emitter electrode 21, and a base electrode 22 is disposed on the opposite side of the emitter electrode 21 from the collector electrode 23. The via-hole 25 is disposed close to the base electrode 22. The via-hole metal 51 is extended on a region of the substrate 26 between the via-hole 51 and the base electrode 22, i.e., the base electrode 22 is connected through the via-hole metal 51 to the PHS 27.

Figure 18:
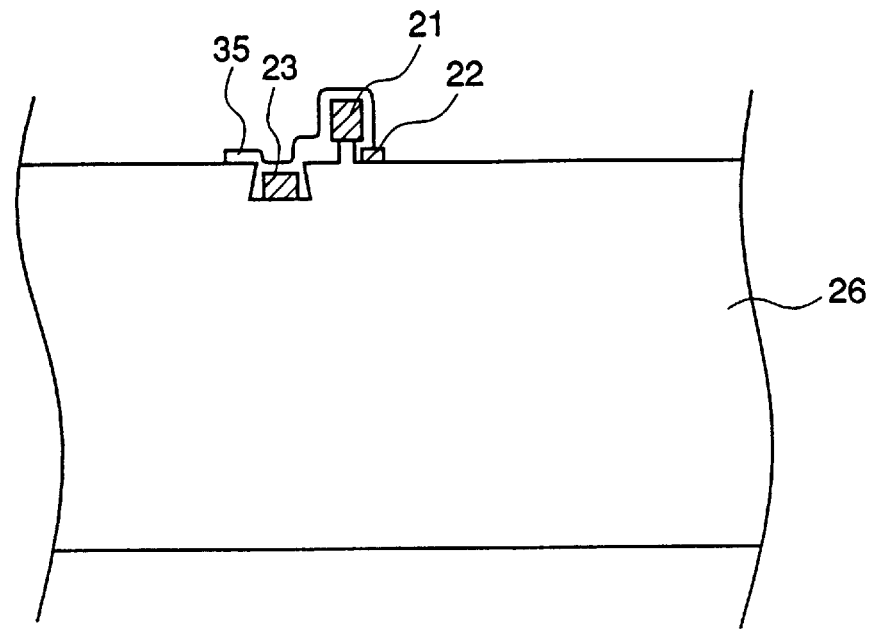
FIGS. 18(a)–18(b) are cross-sectional views illustrating process steps in a method of fabricating the HBT according to the eleventh embodiment of the invention.
Figure 18:
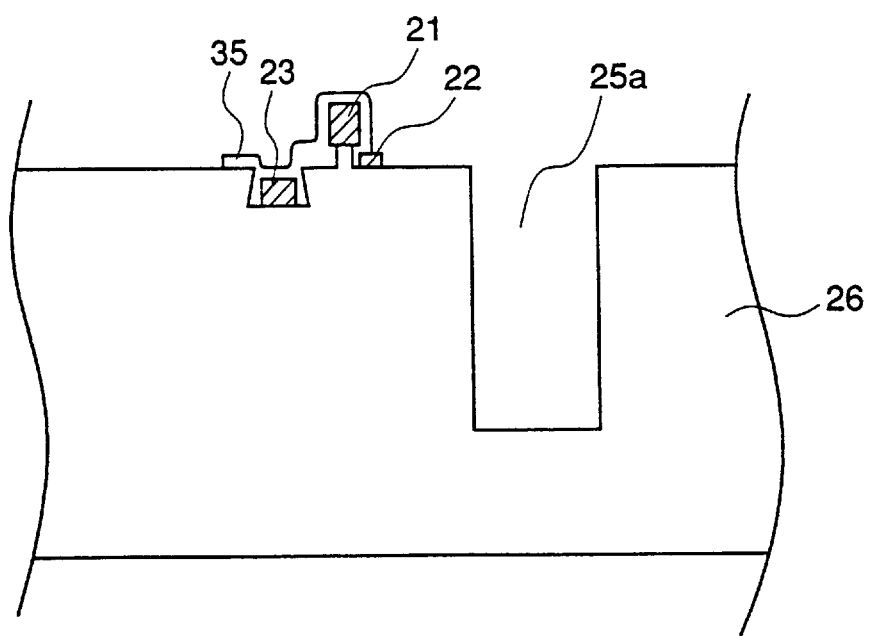

The fabricating method of the HBT according to this eleventh embodiment is illustrated in FIGS. 18(a)–18(b). Initially, as illustrated in FIG. 18(a), an HBT element including an emitter electrode 21, a base electrode 22, and a collector electrode 23 is fabricated on the GaAs substrate 26, and an insulating film (SiON) 35 for protection is deposited over the HBT element. The same metals and semiconductors as described in the first embodiment are employed for the emitter, base, and collector electrodes and the emitter, base, and collector layers, respectively.

In the step of FIG. 18(b), a hole 25a about 30 µm deep is formed in the GaAs substrate 26 at a position close to the base electrode 22 using RIE. Thereafter, a via-hole metal 51 comprising Ti(50 nm)/Au(2 µm) is formed by electroplating, and the GaAs substrate 26 is ground and polished at the rear surface until the via-hole metal 51 is exposed. Finally, 40 µm thick Au is electroplated over the rear surface of the substrate to form a PHS 27, completing the structure shown in FIG. 17(b).

In this eleventh embodiment of the invention, heat generated in the HBT element is transferred to the PHS 27 not only through the substrate just under the element but also through the base electrode 22 and the via-hole metal 51, so that the heat dissipation property of the element is significantly improved. In addition, since both the via-hole metal 51 and the PHS 27 comprise metals having relatively low thermal resistivities and the semiconductor substrate having a relatively high thermal resistivity is not interposed between the via-hole metal 51 and the PHS 27, the thermal resistivity of the HBT element is reduced. Therefore, an unwanted increase in the temperature of the HBT element is suppressed, whereby degradation in electrical characteristics of the HBT element is avoided and the output power and the power addition efficiency of the HBT element are increased. Further, since the base electrode 22 is connected to the via-hole 25 not through an air-bridge wiring but through a portion of the via-hole metal 51 on the surface of the GaAs substrate, the fabricating process is simplified.

Figure 19:
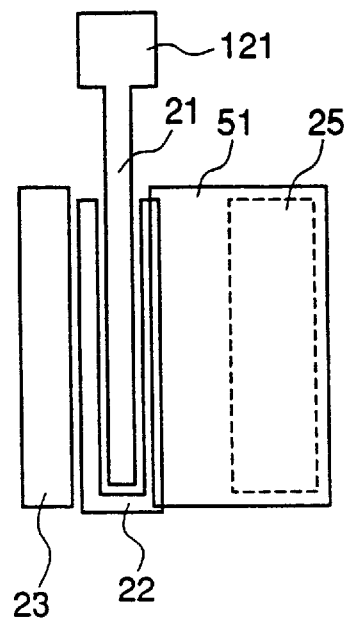
FIGS. 19(a)–19(b) are a plan view and a cross-sectional view, respectively, illustrating an HBT in accordance with a modification of the eleventh embodiment of the invention.
Figure 19:
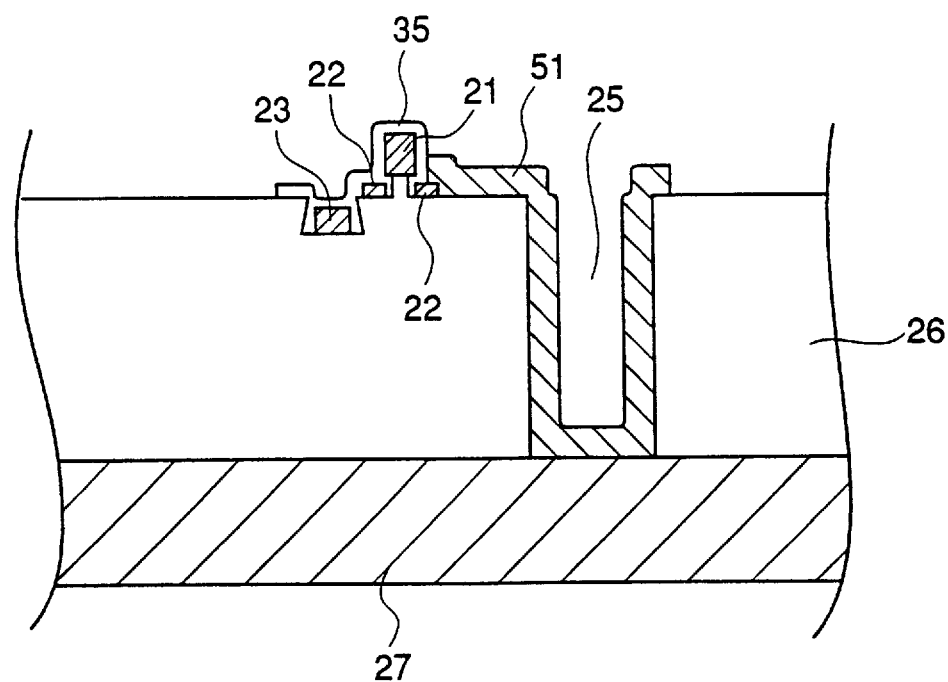

In the HBT shown in FIGS. 17(a)–17(b), the base electrode 22 may be disposed on both sides of the emitter electrode 21. This structure is shown in FIGS. 19(a)–19(b) wherein FIG. 19(a) is a plan view and FIG. 19(b) is a cross-sectional view. As shown in FIG. 19(a), a U-shaped base electrode 22 is disposed surrounding the emitter electrode 21. The fabricating method of this structure is fundamentally identical to the method illustrated in FIGS. 18(a)–18(b). In this HBT, since the base electrode 22 is present on both sides of the emitter electrode 21, the base resistance is further reduced as compared to the HBT shown in FIGS. 17(a)–17(b), whereby the high-frequency characteristics are improved.

[Embodiment 12]

Generally, an HBT element has an emitter-base resistance of 1–2Ω. In the above-described first, second, fourth, fifth, sixth, and seventh embodiments, the emitter electrodes of the HBT elements are electrically connected through the air-bridge wiring and the via-holes to the PHS, and the wiring resistances of the air-bridge and the via-hole metal are low enough to be ignored compared to the emitter-base resistance of the HBT element. Therefore, the emitter-base resistance is dominant in the resistance between the emitter of the HBT element and the PHS. However, the emitter-base resistance varies from element to element as a result of slight variations in the element structure or operating temperatures. Therefore, in the array of the HBT elements whose emitter electrodes are connected to each other through the air-bridge wiring, current is undesirably concentrated in HBT elements having lower emitter-base resistances or higher operating temperatures than other elements even when the difference in the resistances or temperatures is very small. In order to suppress the current concentration in particular HBT elements, a method described hereinafter is conventionally employed. That is, a resistor having a resistance of several ohms is connected between the emitter electrode of each HBT element and the PHS in series, and a voltage drop due to the emitter current is produced in the resistor, whereby the voltage applied to the emitter-base junction of the element with relatively large emitter current is reduced. In this way, the above-described current concentration is suppressed. The resistor inserted between the emitter electrode and the PHS is called a ballast resistor.

However, since a resistor having relatively high thermal resistance, such as a thin metal film resistor, is employed for the ballast resistor, when the ballast resistor is connected in series within the wiring structure comprising the air-bridge wiring and the via-hole metal according to the above-described first, second, fourth, fifth, sixth, and seventh embodiments of the invention, heat conduction from the emitter to the PHS is prevented, resulting in degradation in the heat dissipation property.

This twelfth embodiment of the invention relates to a semiconductor device having a wiring structure in which a ballast resistor can be inserted between the emitter and the PHS in series without adversely affecting the heat dissipation property of the wiring between the emitter and the PHS, and a method for fabricating the semiconductor device.

Figure 20:
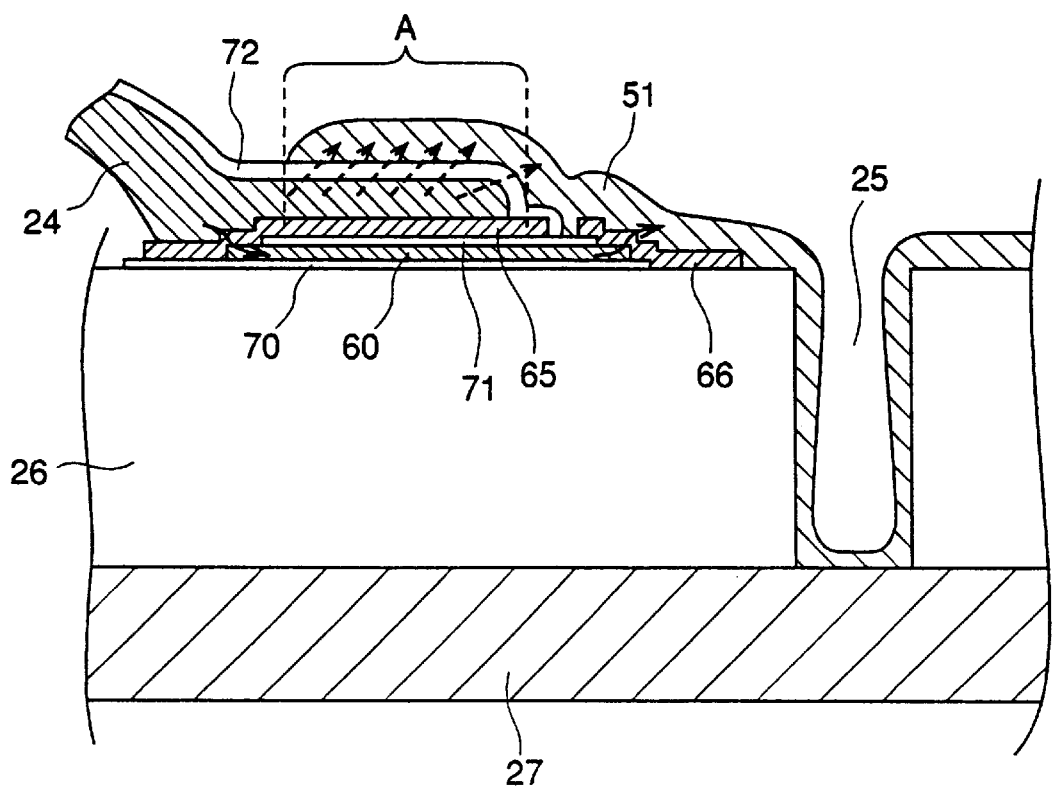
FIGS. 20(a)–20(b) are cross-sectional views illustrating a semiconductor device in accordance with a twelfth embodiment of the present invention.
Figure 20:
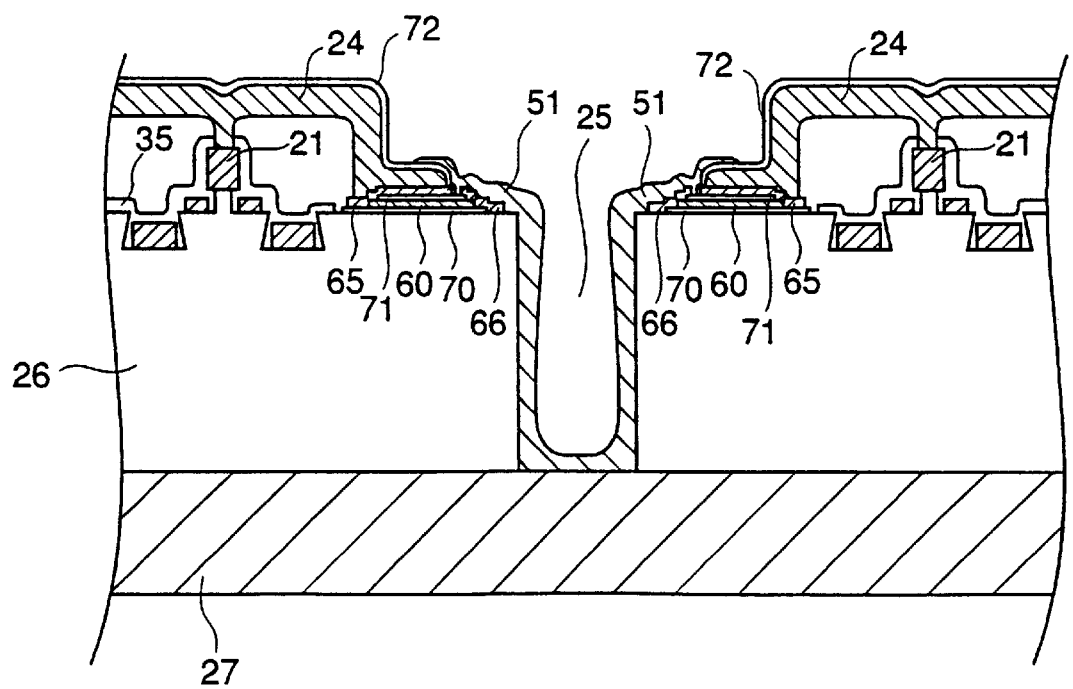

A semiconductor device according to this twelfth embodiment of the invention is shown in FIGS. 20(a) and 20(b). FIG. 20(a) is a cross-sectional view of a part of the semiconductor device in the vicinity of a resistor comprising a thin metal film and serving as a ballast resistor. FIG. 20(b) is a cross-sectional view of a part of the device including HBT elements connected to ballast resistors.

In these figures, reference numeral 21 designates emitter electrodes comprising AuGe(50 nm)/Ni(50 nm)/Au(300 nm), numeral 24 designates air-bridge wirings comprising Ti(50 nm)/Au(2 µm), numeral 25 designates a via-hole, numeral 26 designates a semi-insulating GaAs substrate, numeral 27 designates a PHS comprising Au 40 µm thick, numeral 35 designates insulating films, such as SiON, numeral 51 designates a via-hole metal comprising Ti(50 nm)/Au(2 µm), numeral 60 designates thin metal film resistors comprising WSi 50–100 µm thick (hereinafter referred to simply as thin metal resistors), numerals 65 and 66 designate first and second contact electrodes comprising Ti(50 nm)/Au(200 nm), respectively, numeral 70 designates insulating films for protecting the substrate, such as SiO 100–200 nm thick, and numeral 72 designates inter-wiring insulating films, such as SiO about 1 µm thick. Reference character A designates a heat conducting region. In addition, solid arrows show a current path and dotted arrows show a heat transfer path. In this twelfth embodiment, the air-bridge wiring 24 is electrically connected to the via-hole metal 51 through the first contact electrode 65, the thin metal resistor 60, and the second contact electrode 66. Between the air-bridge wiring 24 and the via-hole metal 51, current flows along the current path shown by the solid arrows in FIG. 20(a). Hereinafter, a part where the first contact electrode 65, the thin metal resistor 60, and the second contact electrode 66 are connected is called a resistance structure. Since the sheet resistance of the thin WSi film is 200–500Ω/□, it is possible for the thin metal resistor have a resistance of about several Ω by appropriately designing the shape of the thin metal resistor, whereby the resistance structure is used as a ballast resistor. On the other hand, the via-hole metal 51 overlaps the air-bridge wiring 24 via the inter-wiring insulating film 72 in the broad heat conducting region A above the thin metal resistor 60 and, therefore, the heat flow along the heat transfer path shown by the dotted arrows in FIG. 20(a) dominates the heat conduction between the air-bridge wiring 24 and the via-hole metal 51. Hereinafter, a part where the air-bridge wiring 24, the inter-wiring insulating film 72, and the via-hole metal 51 overlap each other is called a heat conducting structure. As described above, in this semiconductor laser device, current flows through the resistance structure as shown by the solid arrows and heat flows through the heat conducting structure as shown by the dotted arrows, between the emitter electrode of the HBT element and the PHS.

Figure 21:
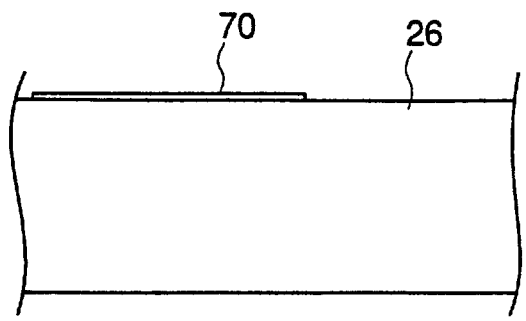
FIGS. 21(a)–21(e) are cross-sectional views illustrating process steps in a method of fabricating the semiconductor device shown in FIGS. 20(a)–20(b).
Figure 21:
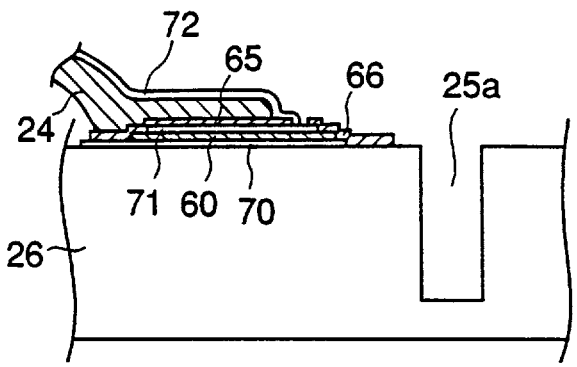
Figure 21:
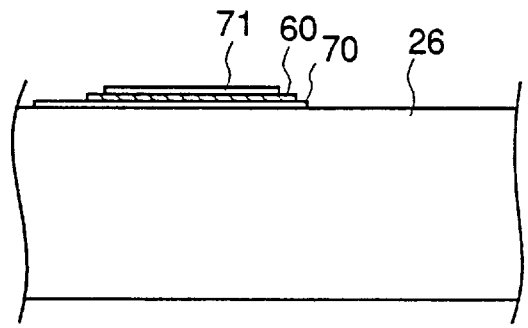
Figure 21:
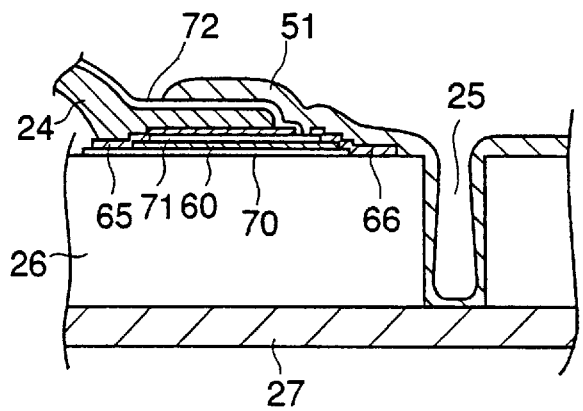
Figure 21:
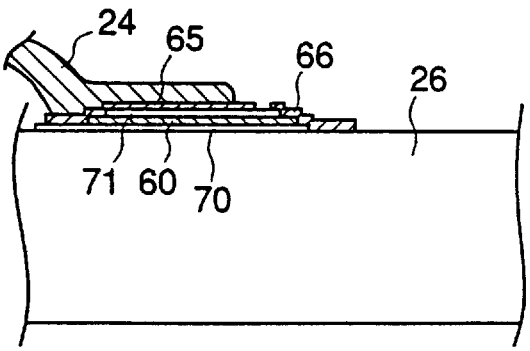

FIGS. 21(a)–21(e) are cross-sectional views illustrating process steps in a method of fabricating the semiconductor device shown in FIGS. 20(a) and 20(b). After fabrication of HBT elements (not shown) on the surface of the GaAs substrate 26, an SiO film 0.1–0.2 µm thick is deposited over the entire surface of the substrate by plasma CVD and patterned by photolithography and etching, forming a substrate protecting insulating film 70 comprising SiO on the substrate 26 between each HBT element and a region where a via-hole is later formed, as shown in FIG. 21(a).

Thereafter, as illustrated in FIG. 21(b), a WSi film 50–100 nm thick is deposited over the entire surface by sputtering and patterned by photolithography and RIE, forming a thin metal resistor 60 comprising WSi on the substrate protecting insulating film 70. Further, an SiO film 0.1–0.2 µm thick is deposited over the entire surface by plasma CVD and patterned by photolithography and etching, forming a resistor covering insulating film 71 that covers the thin metal film resistor 60 except portions to be in contact with first and second contact electrodes 65 and 66 which are later produced.

In the step of FIG. 21(c), the first and second contact electrodes 65 and 66 comprising Ti(50 nm)/Au(200 nm) are formed using photolithography, vapor deposition, and lift-off, contacting the uncovered portions of the thin metal film resistor 60. These first and second contact electrodes 65 and 66 must be separated from each other. In this way, the above-described resistance structure is produced. In the step of FIG. 21(c), the contact electrode 65 is formed covering a broad region on the resistor covering insulating film 71. The above-described heat conducting structure is later produced on this region. Next, an air-bridge wiring 24 comprising Ti(50 nm)/Au(2 µm) is fabricated by electroplating, contacting the first contact electrode 65 at a portion and contacting the emitter electrode of the HBT element at another portion. As shown in FIG. 21(c), the air-bridge wiring 24 is formed covering a broad region on the electric resistance structure. After fabrication of the air-bridge wiring 24, as illustrated in FIG. 21(d), an SiO film 1 µm thick is deposited over the entire surface by plasma CVD and patterned by photolithography and etching, forming an inter-wiring insulating film 72 covering the surface of the air-bridge wiring 24 and the exposed portion of the first contact electrode 65. Further, a prescribed region of the GaAs substrate 26 is etched to form a hole 25a for a via-hole. Thereafter, as illustrated in FIG. 21(e), a via-hole metal 51 comprising laminated metal films of Ti(50 nm)/Au(2 µm) is plated on a region including the surface of the inter-wiring insulating film 72 on the electrical resistance structure and the inner surface of the hole 25a. In this way, the heat conducting structure in which the air-bridge wiring 24, the inter-wiring insulating film 72, and the via-hole metal layer 51 overlap each other is produced on the resistance structure.

Finally, the GaAs substrate 26 is ground and polished at the rear surface until the via-hole metal 51 on the bottom of the hole 25a is exposed and, thereafter, 40 µm thick Au is plated over the rear surface of the substrate 26 to form a PHS 27, completing the semiconductor device shown in FIGS. 20(a) and 20(b).

In this twelfth embodiment of the invention, when the thickness of the inter-wiring insulating film 72 comprising SiO is about 1 µm, the width of the heat conducting structure in the cross-section of FIG. 20(a) is 3 µm, and the length of the heat conducting structure on the GaAs substrate in the direction perpendicular to the cross-section of FIG. 20(a) is as long as the emitter length of the HBT element, i.e., in a range of 10–20 µm, the thermal resistance of the inter-wiring insulating film 72 in the heat conducting structure is significantly lower than the thermal resistance of the heat transfer path in the resistance structure through the first contact electrode 65, the resistor 60, and the second contact electrode 66 between the portions of the air-bridge wiring 24 and the via-hole metal 51 respectively thermally connected to the first and second contact electrodes. Further, the thermal resistance of the inter-wiring insulating film 72 is less than 1% of the thermal resistance of the entire heat transfer path from the emitter electrode of the HBT element to the PHS. That is, even when the thin metal resistor 60 serving as a ballast resistor is inserted between the air-bridge wiring 24 and the via-hole metal 51 in series, the heat dissipation from the emitter electrode to the PHS is not degraded. Accordingly, as in the above-described embodiments of the invention, the thermal resistance from the emitter electrode to the PHS is reduced, the inductance of the air-bridge wiring is reduced, and the thermal separation between the HBT elements is improved. In addition, the current concentration caused by variations in the emitter-base resistances of the HBT elements is suppressed.

Further, since the he at conducting structure is located on the resistance structure, the area of the semiconductor device on the semiconductor substrate is reduced. Further, since the first and second contact electrodes 65 and 66 are disposed between the air-bridge wiring 24 and the thin metal film resistor 60 and between the thin metal film resistor 60 and the via-hole metal 51, respectively, the contact resistance between them is reduced and the reliability of the electrical contact between them is increased. Furthermore, because a thin metal film is used as the electrical resistor 60, the electric resistance of the resistance structure is precisely controlled. Furthermore, because the resistor 60 is insulated from the semiconductor substrate 26 by the substrate protecting insulating film 70, undesired interaction between the resistor 60 and other elements on the semiconductor substrate through the semiconductor substrate is avoided. As a result, a semiconductor device having stable operation is realized.

In place of WSi, WSiN or TiN may be used for the thin metal resistor 60. Likewise, in place of SiO, SiON or SiN may be used for the substrate protecting insulating film 70, the resistor covering insulating film 71, and the inter-wiring insulating film 72.

Although in this twelfth embodiment emphasis has been placed upon an emitter-grounded HBT, a base-grounded HBT having a similar structure is also within the scope of the present invention. In this case, the air-bridge wiring 24 is connected to the base electrode 22.

[Embodiment 13]

Figure 22:
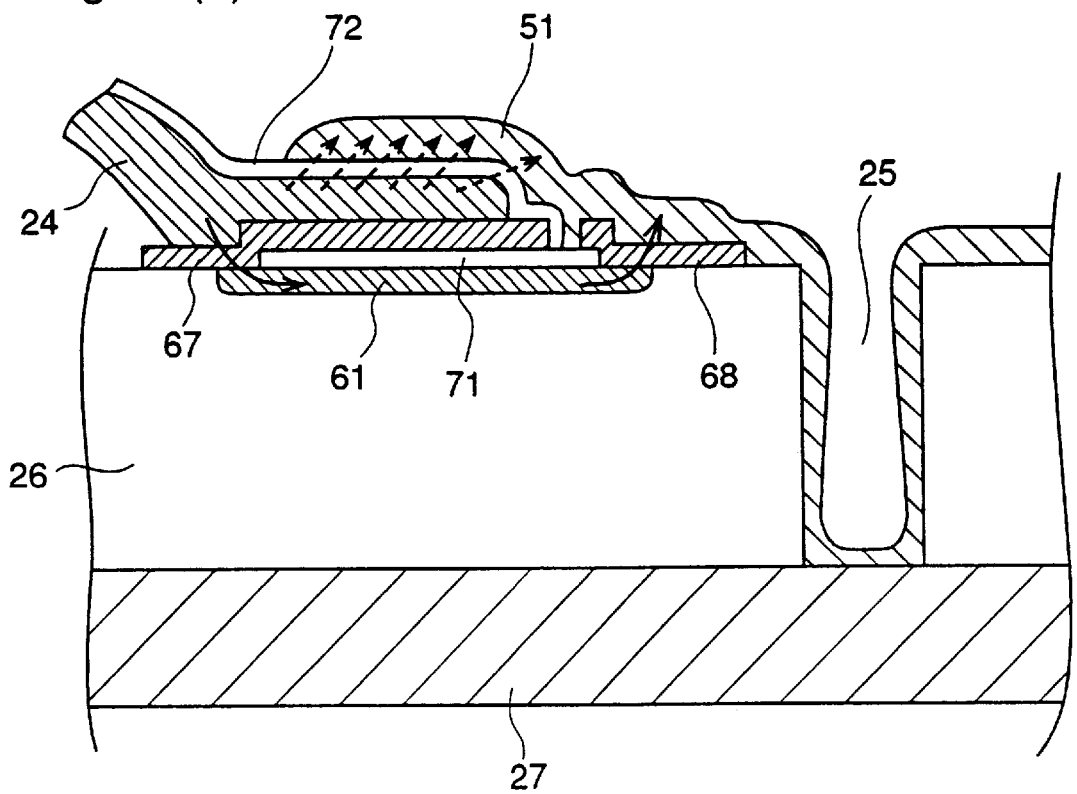
FIGS. 22(a) and 22(b) are cross-sectional views illustrating a semiconductor device in accordance with a thirteenth embodiment of the present invention.
Figure 22:
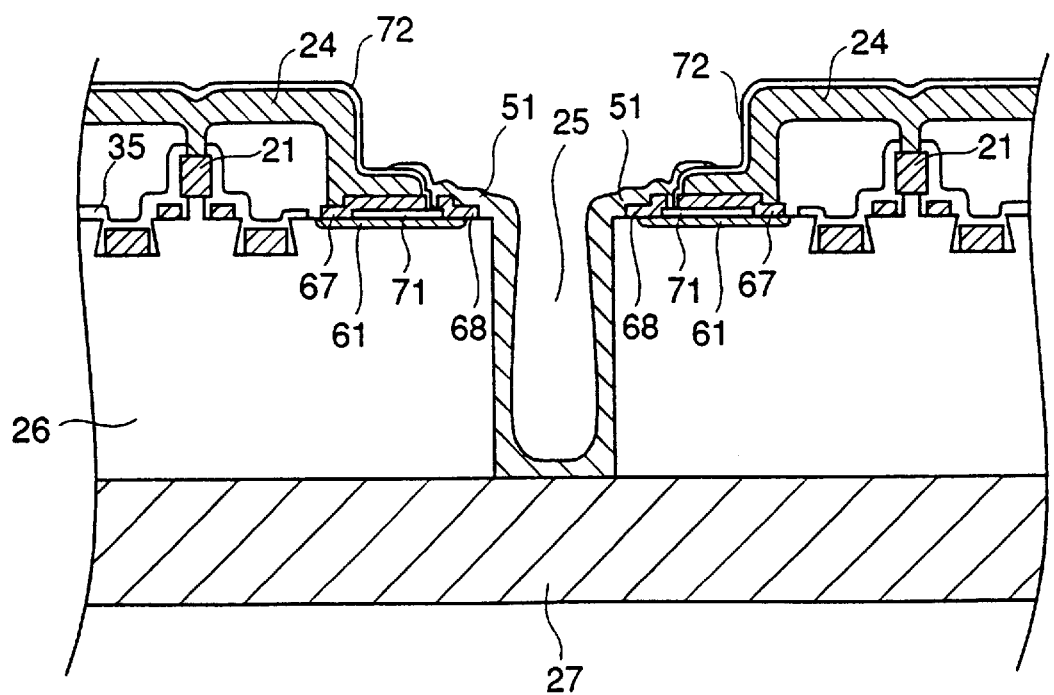

While in the above-described twelfth embodiment a thin metal film is used as the resistor serving as a ballast resistor, in this thirteenth embodiment, an ion implanted semiconductor layer is used as the resistor. A semiconductor device according to this thirteenth embodiment of the invention is shown in FIGS. 22(*a*) and 22(*b*). FIG. 22(*a*) is a cross-sectional view of a part of the device in the vicinity of the electrical resistor comprising an ion-implanted semiconductor layer and serving as a ballast resistor. FIG. 22(*b*) is a cross-sectional view of the device including HBT elements connected to the ballast resistors. In these figures, the same reference numerals as in FIGS. 20(*a*) and 20(*b*) designate the same or corresponding parts. Reference numeral 61 designates the resistor comprising an ion-implanted semiconductor layer (hereinafter referred to simply as ion-implanted resistor), for example, an n type GaAs layer. Reference numerals 67 and 68 designate first and second ohmic contact electrodes comprising AuGe(50 nm)/Ni(10 nm)/Au (200–300 nm). In this thirteenth embodiment of the invention, the air-bridge wiring 24 and the via-hole metal 51 are electrically connected to each other through the first ohmic contact electrode 67, the ion implanted resistor 61, and the second ohmic contact electrode 68, thereby providing an resistance structure. It is possible to reduce the resistance of the ion-implanted resistor 61 to several Ω by appropriately setting the shape and the carrier concentration of the resistor 61, so that the resistance structure can be used as a ballast resistor. On the other hand, the air-bridge wiring 24 and the via-hole metal 51 overlap each other through the inter-wiring insulating film 72 at a broad region on the ion-implanted resistor 61, thereby providing a heat conducting structure. Therefore, heat flow through the heat conducting structure dominates the heat conduction between the air-bridge wiring 24 and the via-hole metal 51. In this way, also in the semiconductor device according to this thirteenth embodiment of the invention, between the emitter electrode 21 of the HBT element and the PHS 27, current flows through the resistance structure as shown by solid arrows while heat flows through the heat conducting structure as shown by dotted arrows.

Figure 23:
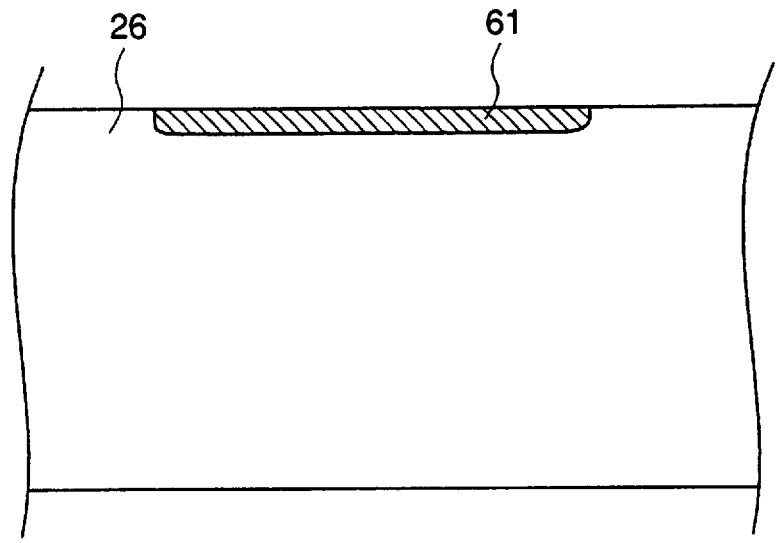
FIGS. 23(a) and 23(b) are cross-sectional views illustrating process steps in a method of fabricating the semiconductor device shown in FIGS. 22(a)–22(b).
Figure 23:
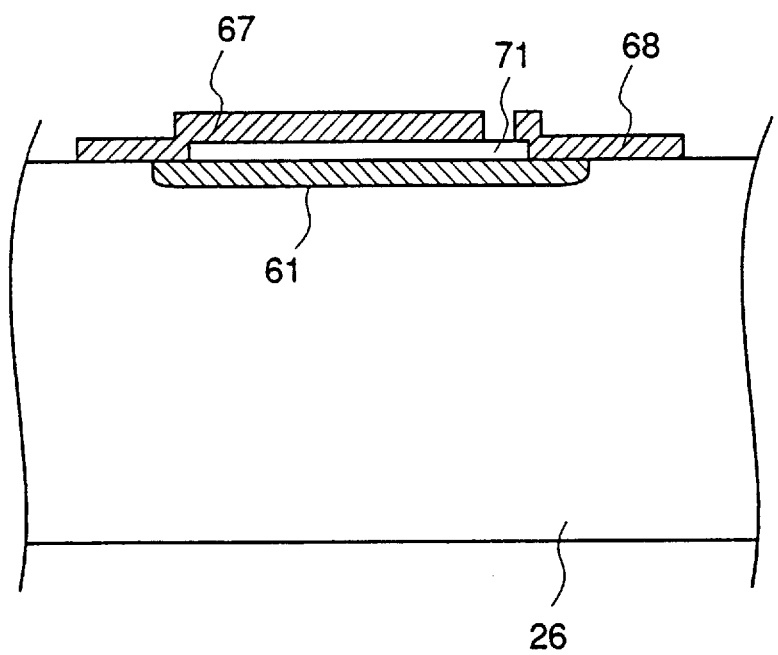

FIGS. 23(*a*) and 23(*b*) are cross-sectional views illustrating process steps in a method of fabricating the semiconductor device according to the thirteenth embodiment of the invention. Initially, as illustrated in FIG. 23(*a*), in the process of fabricating HBT elements (not shown) at the surface of the GaAs substrate 26, after forming the emitter mesas and before forming the electrodes, Si ions are implanted into a prescribed region at the surface of the substrate 26 where the ion-implanted resistor 61 is to be produced. Thereafter, annealing for recovering crystallinity of ion-implanted insulating regions that separate the HBT elements from each other is performed. During the annealing, the Si-ion implanted region is activated to become an n type GaAs region, thereby producing the ion-implanted resistor 61. The n type GaAs region serving as the resistor has a thickness of $0.1\mu$ and a carrier concentration of $10^{17}-5\times10^{18}/\text{cm}^3$. Thereafter, electrodes of the HBT elements and the protective film are produced.

Next, as illustrated in FIG. 23(*b*), an SiO film 0.1–0.2 $\mu$m thick is deposited over the entire surface by plasma CVD and patterned by photolithography and etching to form a resistor covering insulating film 71 that covers the ion-implanted resistor 61 except portions to be in contact with first and second ohmic contact electrodes 67 and 68 which are later produced. Thereafter, first and second ohmic contact electrodes 67 and 68 comprising AuGe(50 nm)/Ni(10 nm)/Au(200–300 nm) are formed by photolithography, vapor deposition, and lift-off, contacting the uncovered portions of the ion-implanted resistor 61. However, these two ohmic contact electrodes should not contact each other. In this way, the above-described resistance structure is produced. In this process, the first ohmic contact electrode 67 is formed covering a broad region on the resistor covering insulating film 71. A heat conducting structure will be produced on this region in the subsequent process steps. The process steps for fabricating the heat conducting structure, i.e., the air-bridge wiring 24, the inter-wiring insulating film 72, and the via-hole 25, and the PHS 27 are identical to those already described with respect to FIGS. 21(*c*)–21(*e*) according to the twelfth embodiment of the invention. As a result, the semiconductor device shown in FIGS. 22(*a*) and 22(*b*) is completed.

In this thirteenth embodiment of the invention, as in the above-described twelfth embodiment, the thermal resistance of the inter-wiring insulating film 72 in the heat conducting structure is significantly lower than the thermal resistance of the electric resistance structure and, moreover, it is less than 1% of the thermal resistance of the entire heat transfer path from the emitter electrode 21 of the HBT element to the PHS 27. That is, even when the ion-implanted resistor 61 serving as a ballast resistor is connected in series between the air-bridge wiring 24 and the via-hole metal 51, the heat dissipation from the emitter electrode 21 to the PHS 27 is not degraded. Accordingly, as in the above-described embodiments of the invention, the thermal resistance from the emitter electrode 21 to the PHS 27 is reduced, the inductance of the air-bridge wiring 24 is reduced, and the thermal separation between the HBT elements is improved. In addition, unwanted current concentration caused by variations in the emitter-base resistances of the HBT elements is suppressed.

Further, since the heat conducting structure is located on the resistance structure, the area of the semiconductor device on the semiconductor substrate is reduced. Further, since the first and second ohmic contact electrodes 67 and 68 are disposed between the air-bridge wiring 24 and the ion-implanted resistor 61 and between the ion-implanted resistor 61 and the via-hole metal 51, respectively, the contact resistance between them is reduced and the reliability of the electrical contact between them is increased. Furthermore, the resistance of the resistance structure is easily controlled in a wide range by the dopant concentration of the ion-implanted resistor 61.

Furthermore, in the fabricating method of the semiconductor device according to this thirteenth embodiment of the invention, the electric resistor 61 is produced by the ion implantation alone. Therefore, the fabricating process of the resistor according to this thirteenth embodiment is simpler than the process according to the twelfth embodiment in which a thin metal film is deposited and patterned by photolithography and etching to form the electric resistor.

Although in this thirteenth embodiment Si ions are employed for the ion-implantation to produce the ion-implanted resistor 61, n type dopants, such as Se and Te, or p type dopants, such as Be, MG, and C, may be employed. However, when a p type region is used for the ion-implanted resistor 61, a material that makes an ohmic contact with the p type region, such as AuZn, Ti, Pt, or Au, must be employed for the first and second ohmic contact electrodes 67 and 68.

[Embodiment 14]

Figure 24:
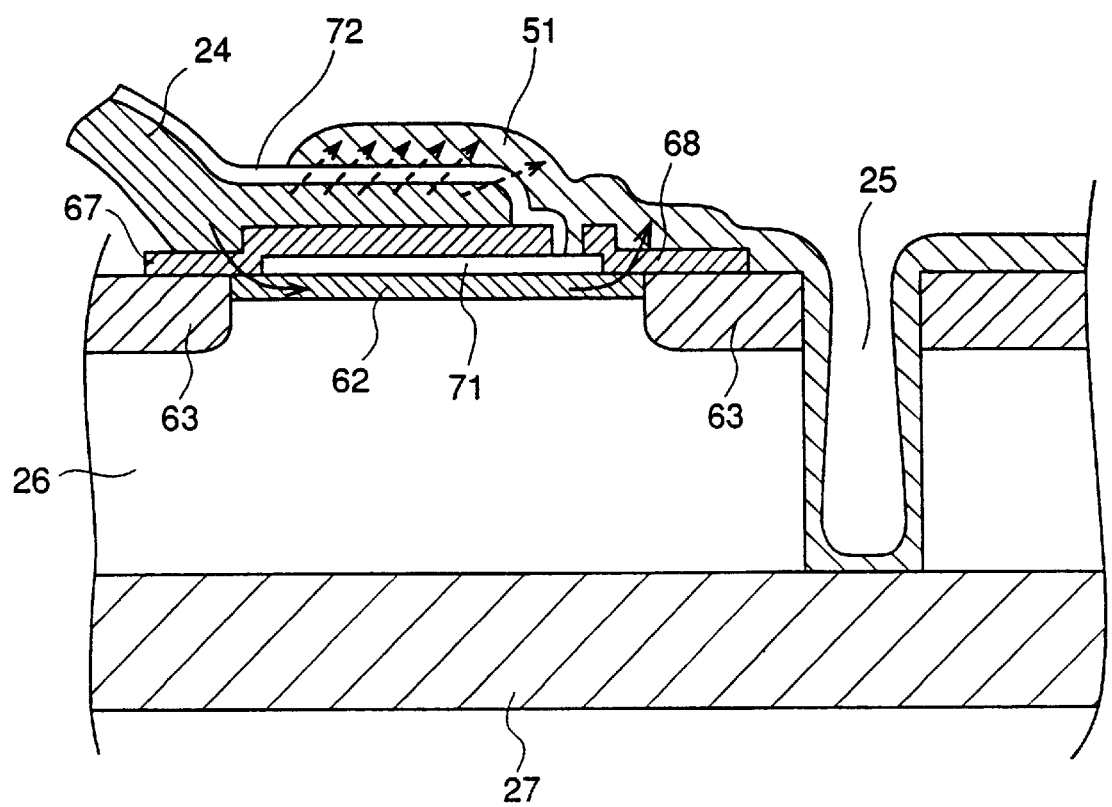
FIG. 24 is a cross-sectional view illustrating a semiconductor device in accordance with a fourteenth embodiment of the present invention.

While in the above-described twelfth embodiment the resistor serving as a ballast resistor comprises a thin metal film, in this fourteenth embodiment the resistor comprises an epitaxially grown semiconductor layer. FIG. 24 is a cross-sectional view illustrating a semiconductor device according to the fourteenth embodiment of the invention. In the figure, the same reference numerals as in FIGS. 20(a) and 22(a) designate the same or corresponding parts. Reference numeral 62 designates an resistor comprising an epitaxially grown semicondutor layer, for example, an n type GaAs layer (hereinafter referred to as an epitaxial layer resistor). Reference numeral 63 designates implanted insulating regions.

In this fourteenth embodiment of the invention, the air-bridge wiring 24 and the via-hole metal 51 are electrically connected to each other through the first ohmic contact electrode 67, the epitaxial layer resistor 62, and the second ohmic contact electrode 68. The epitaxial layer resistor 62 and the ohmic contact electrodes 67 and 68 provide a resistance structure. On the other hand, the air-bridge wiring 24 and the via-hole metal 51 overlap each other through the inter-wiring insulating film 72 in a broad region on the epitaxial layer resistor 62, thereby providing a heat conducting structure. Therefore, heat flow through the heat conducting structure dominates the heat conduction between the air-bridge wiring 24 and the via-hole metal 51. In this way, also in the semicondutor device shown in FIG. 24, between the air-bridge wiring 24 and the PHS 27, current flows through the resistance structure shown by solid arrows while heat flows through the heat conducting structure shown by dotted arrows.

Figure 25:
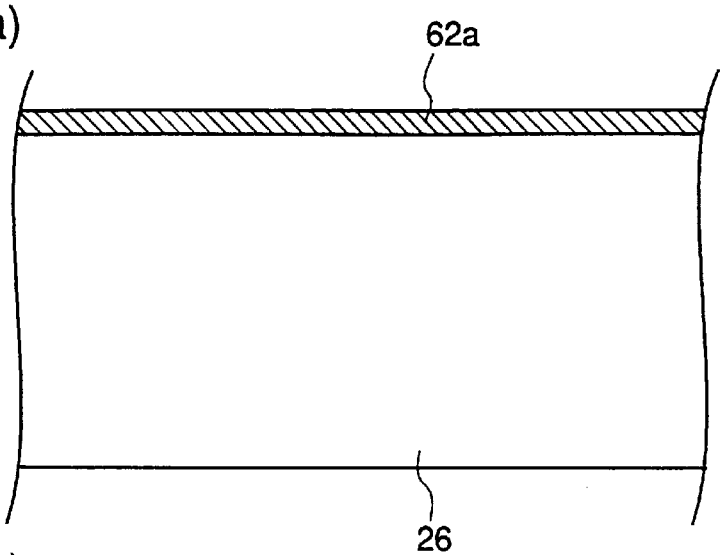
FIGS. 25(a)–25(c) are cross-sectional views illustrating process steps in a method of fabricating the semiconductor device shown in FIG. 24.
Figure 25:
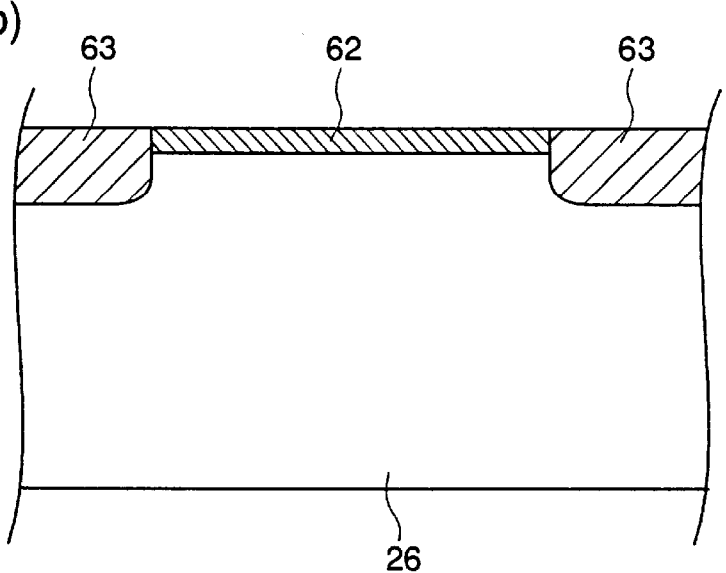
Figure 25:
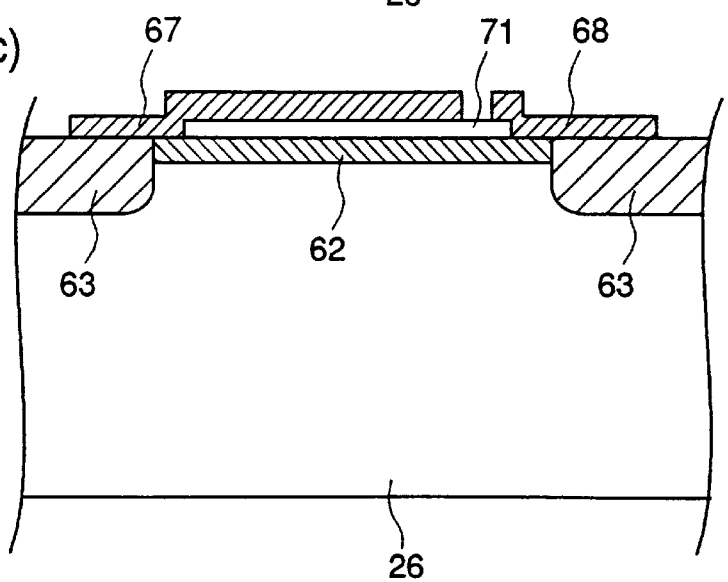
Figure 26:
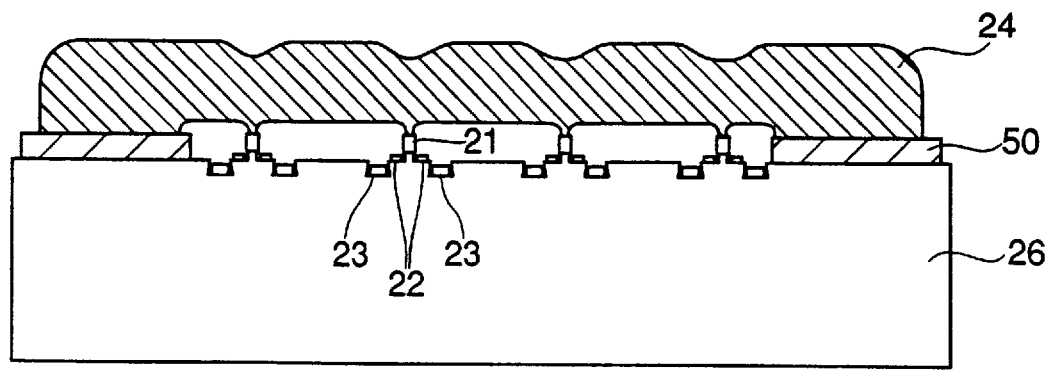
FIG. 26 is a cross-sectional view illustrating an HBT according to the prior art.

FIGS. 25(a)–25(c) are cross-sectional views illustrating process steps in a method of fabricating the semiconductor device according to the fourteenth embodiment of the invention. Initially, as illustrated in FIG. 25(a), an n type GaAs layer 62a is epitaxially grown on the surface of the GaAs substrate 26. Then, as illustrated in FIG. 25(b), H$^+$ or B$^+$ ions are implanted in prescribed regions of the substrate to form insulating regions 63, whereby an isolated epitaxially grown n type GaAs resistor 62 is produced. The epitaxial layer resistor 62 has a thickness of 0.1 $\mu$m and a carrier concentration of $10^{17}$–$5\times10^{18}$/cm$^3$.

In the step of FIG. 25(c), an SiO film 0.1–0.2 $\mu$m thick is deposited over the entire surface by plasma CVD and patterned by photolithography and etching to form a resistor covering insulating film 71 comprising the SiO film and covering the surface of the epitaxial layer resistor 62 except portions to be in contact with first and second ohmic contact electrodes which are later produced. Thereafter, first and second ohmic contact electrodes 67 and 68 comprising AuGe(50 nm)/Ni(10 nm)/Au(200–300 nm) are formed by photolithography, vapor deposition, and lift-off, contacting the uncovered portions of the epitaxial layer resistor 62. However, these two ohmic contact electrodes 67 and 68 should not contact each other. In this way, the above-described resistance structure is produced. In this process, the first ohmic contact electrode 67 is formed covering a broad region on the resistor covering insulating film 71. A heat conducting structure will be produced on this region in the subsequent process steps. The fabrication of the heat conducting structure, i.e., the air-bridge wiring 24, the inter-wiring insulating film 72, and the via-hole 25, and the fabrication of the PHS 27 are identical to those already described with respect to FIGS. 21(c)–21(e) according to the twelfth embodiment of the invention. As a result, the semiconductor device shown in FIG. 24 is completed.

In this fourteenth embodiment of the invention, as in the above-described twelfth embodiment, the thermal resistance of the inter-wiring insulating film 72 in the heat conducting structure is significantly lower than the thermal resistance of the electric resistance structure and, moreover, it is significantly lower than the thermal resistance of the entire heat transfer path from the emitter electrode 21 of the HBT element to the PHS 27. Further, since the heat conducting structure is located on the resistance structure, the area of the semiconductor device on the semiconductor substrate is reduced. Further, since the first and second ohmic contact electrodes 67 and 68 are disposed between the air-bridge wiring 24 and the epitaxial layer resistor 62 and between the epitaxial layer resistor 62 and the via-hole metal 51, respectively, the contact resistance between them is reduced and the reliability of the electrical contact between them is increased. Furthermore, the resistance of the resistance structure is easily controlled in a wide range by the dopant concentration of the epitaxial layer resistor 62.

While in the above-described fourteenth embodiment the division of the epitaxially grown layer into a plurality of epitaxial layer resistors is carried out by ion implantation to form insulating regions between the resistors, it may be carried out by etching portions of the epitaxially grown layer between the epitaxial layer resistors.

In the foregoing description, emphasis has been placed upon HBTs employing AlGaAs/GaAs/GaAs for emitter/base/collector. However, similar HBTs or bipolar transistors employing the following materials for emitter/base/collector are also within the scope of the present invention: Si/SiGe/Si, Si/Ge/SiGe, SiGe/Ge/SiGe, SiGe/Ge/Ge, Si/Si/Si, SiC/Si/Si, SiC/SiGe/Si, AlGaAs/GaInAs/GaAs, GaInP/GaAs/GaAs, AlGaInP-GaInP/GaAs/GaAs, AlGaInP/GaAs/GaAs, AlGaInP-GaInP/GaInP/GaAs, AlGaInP/GaInP/GaAs, GaAsP/GaAs/GaAs, GaAsP/GaInAs/GaAs, InP/GaInAs/InP, Al(Ga)InAs/GaInAs/InP, Al(Ga)InAs/InP/InP, Al(Ga)InAs/GaInAs/InP, and Al(Ga)InAs/InP/InP. In addition, those HBTs and bipolar transistors may be of either n-p-n or p-n-p type.

What is claimed is:

1. A semiconductor device comprising:
   a semiconductor substrate having opposite front and rear surfaces;
   a bipolar transistor disposed on the front surface of the semiconductor substrate and including an emitter electrode, a base electrode, a collector electrode, and a heat generating region;
   a plated heat sink for dissipating heat generated in the heat generating region of the bipolar transistor, the plated heat sink comprising a metal layer disposed on the rear surface of the semiconductor substrate;
   a via-hole comprising a through-hole penetrating through the semiconductor substrate from the front surface to the rear surface and having an inner surface, and a metal disposed in the through-hole and contacting the plated heat sink; and
   a first wiring comprising a metal film having first and second portions, the first portion contacting the base electrode of the bipolar transistor at the first portion and contacting the metal of the via-hole at the second portion.

2. The semiconductor device of claim 1 wherein said first wiring includes an air-bridge.

3. The semiconductor device of claim 2 wherein the base electrode is grounded.

4. The semiconductor device of claim 2 wherein the second portion of the air-bridge is directly connected to the metal of the via-hole.

5. The semiconductor device of claim 2 including:
   a second wiring disposed on the front surface of the semiconductor substrate close to the via-hole, the second wiring contacting the air-bridge and contacting the metal of the via-hole.

6. The semiconductor device of claim 2 wherein the metal of the via-hole is a metal film disposed on the inner surface of the through-hole.

7. The semiconductor device of claim 6 wherein the metal film of the via-hole and the metal film of the air-bridge comprise the same material and are united with each other.

8. The semiconductor device of claim 2 wherein the metal of the via-hole fills the through-hole.

9. The semiconductor device of claim 8 including
   a via-hole upper electrode comprising a metal film with opposite upper and lower surfaces and disposed on a region of the front surface of the semiconductor substrate including an opening of the via-hole, the via-hole upper electrode contacting the metal of the via-hole at the lower surface and contacting the second portion of the air-bridge wiring at the upper surface.

10. The semiconductor device of claim 2 including a plurality of the bipolar transistors arranged in an array on the front surface of the semiconductor substrate.

11. The semiconductor device of claim 10 including a plurality of the via-holes located on both sides of the array of the bipolar transistors and between the bipolar transistors.

12. The semiconductor device of claim 11 wherein at least one of the via-holes has a width perpendicular to the array of the bipolar transistors larger than a corresponding width of the heat generating region of the bipolar transistor.

13. The semiconductor device of claim 11 including:
   heat dissipating metal films disposed on the front surface of the semiconductor substrate on both sides of the array of the bipolar transistors and between the bipolar transistors where the via-holes are absent, each heat dissipating metal film contacting the air-bridge.

14. The semiconductor device of claim 10 wherein the via-hole surrounds the bipolar transistors, leaving a region of the substrate under the bipolar transistor connected to the substrate outside the via-hole.

15. The semiconductor device of claim 1 wherein the emitter electrode has opposite first and second sides, the collector electrode is disposed on the first side of and spaced from the emitter electrode, and the base electrode is disposed on the second side of and spaced from the emitter electrode, the first wiring and the via-hole include a continuous metal layer, and the via-hole is disposed on the second side of the emitter electrode and adjacent to the base electrode.

16. The semiconductor device of claim 15 including a second base electrode in a region between the emitter electrode and the collector electrode, the second base electrode being electrically connected to the base electrode.

17. A semiconductor element comprising:
   a semiconductor substrate having opposite front and rear surfaces;
   a plurality of bipolar transistors disposed on the front surface of the semiconductor substrate in an array, each bipolar transistor including an emitter electrode, a base electrode, and a collector electrode;
   heat dissipating metal films disposed on the front surface of the semiconductor substrate on opposite sides of and between the bipolar transistors; and
   a wiring having first and second portions, the wiring contacting the base electrodes of each of the bipolar transistors at the first portions and extending to and contacting the heat dissipating metal films at the second portions.

18. The semiconductor device of claim 17 wherein the wiring includes an air-bridge.

19. The semiconductor device of claim 18 wherein each base electrode is grounded.

* * * * *

UNITED STATES PATENT AND TRADEMARK OFFICE
CERTIFICATE OF CORRECTION

PATENT NO. : 5,864,169
DATED : January 26, 1999
INVENTOR(S) : Shimura et al.

It is certified that error appears in the above-identified patent and that said Letters Patent is hereby corrected as shown below:

On the title page, item[57]:

Abstract Line 11, delete "wiring";

Column 36, Line 24, change "transistors to --transistor--.

Signed and Sealed this

Twenty-seventh Day of July, 1999

Attest:

Q. TODD DICKINSON

*Attesting Officer*     *Acting Commissioner of Patents and Trademarks*